(12) United States Patent
Fox et al.

(10) Patent No.: US 8,866,367 B2
(45) Date of Patent: Oct. 21, 2014

(54) THERMALLY OXIDIZED SEED LAYERS FOR THE PRODUCTION OF {001} TEXTURED ELECTRODES AND PZT DEVICES AND METHOD OF MAKING

(75) Inventors: Glen R. Fox, Colorado Springs, CO (US); Ronald G. Polcawich, Derwood, MD (US); Daniel M. Potrepka, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 228 days.

(21) Appl. No.: 13/488,925

(22) Filed: Jun. 5, 2012

(65) Prior Publication Data

US 2013/0093288 A1    Apr. 18, 2013

Related U.S. Application Data

(63) Continuation-in-part of application No. 13/436,349, filed on Mar. 30, 2012, now abandoned.

(60) Provisional application No. 61/547,879, filed on Oct. 17, 2011, provisional application No. 61/547,990, filed on Oct. 17, 2011.

(51) Int. Cl.

| | |
|---|---|
| H01L 41/04 | (2006.01) |
| H01L 41/318 | (2013.01) |
| H01L 41/187 | (2006.01) |
| H01L 41/319 | (2013.01) |
| H01L 41/08 | (2006.01) |
| C30B 23/02 | (2006.01) |
| C30B 29/32 | (2006.01) |
| C30B 29/02 | (2006.01) |

(52) U.S. Cl.
CPC .............. *C30B 29/02* (2013.01); *H01L 41/318* (2013.01); *H01L 41/1876* (2013.01); *H01L 41/319* (2013.01); *H01L 41/0815* (2013.01); *H01L 41/081* (2013.01); *C30B 23/02* (2013.01); *C30B 29/32* (2013.01)
USPC ........................... 310/357; 310/359; 310/360

(58) Field of Classification Search
CPC ....... H01L 41/107; H01L 41/18; H01L 41/39; H03H 9/02157; H03H 9/02015; H05B 41/2822
USPC .......................................... 310/357, 359, 360
See application file for complete search history.

(56) References Cited

U.S. PATENT DOCUMENTS 4,677,336 A * 6/1987 Kushida et al. ............... 310/334
5,612,536 A    3/1997 Torii et al.

(Continued)

OTHER PUBLICATIONS

T. Matsumoto, K. Tamai, Y. Murashima, K. Komaki, S. Nakagawa, "Development of Pt/MgO(100) Buffer Layers for Orientation Control of Perovskite Oxide Thin Films," Jpn. J. Appl. Phys., 47,(9) pp. 7565-7569.

(Continued)

*Primary Examiner* — Thomas Dougherty
*Assistant Examiner* — Bryan Gordon
(74) *Attorney, Agent, or Firm* — Eric B. Compton

(57) ABSTRACT

A method for forming an electrical device having a {100}-textured platinum electrode comprising: depositing a textured metal thin film onto a substrate; thermally oxidizing the metal thin film by annealing to convert it to a rocksalt structure oxide with a {100}-texture; depositing a platinum film layer; depositing a ferroelectric film. An electrical device comprising a substrate; a textured layer formed on the substrate comprising metal oxide having a rocksalt structure; a first electrode film layer having a crystallographic texture acting as a template; and at least one ferroelectric material layer exhibiting spontaneous polarization epitaxially deposited on the first electrode film layer whereby the rocksalt structure of the textured layer facilitates the growth of the first electrode film layer with a {100} orientation which forms a template for the epitaxial deposition of the ferroelectric layer such that the ferroelectric layer is formed with an {001} orientation.

20 Claims, 27 Drawing Sheets

(56) References Cited

U.S. PATENT DOCUMENTS

| | | | |
|---|---|---|---|
| 5,662,818 A | 9/1997 | Nomura et al. | |
| 5,739,563 A | 4/1998 | Kawakubo et al. | |
| 5,955,213 A | 9/1999 | Yano et al. | |
| 6,054,331 A | 4/2000 | Woo et al. | |
| 6,105,225 A | 8/2000 | Torii et al. | |
| 6,312,819 B1 * | 11/2001 | Jia et al. | 428/450 |
| 6,319,764 B1 | 11/2001 | Basceri et al. | |
| 6,347,862 B1 | 2/2002 | Kanno et al. | |
| 6,599,757 B1 | 7/2003 | Murai | |
| 6,645,807 B2 | 11/2003 | Tsuzumitani et al. | |
| 6,682,772 B1 | 1/2004 | Fox et al. | |
| 6,728,093 B2 | 4/2004 | Fox | |
| 6,822,302 B2 | 11/2004 | Higuchi et al. | |
| 6,841,817 B2 | 1/2005 | Kurasawa et al. | |
| 6,853,535 B2 | 2/2005 | Fox et al. | |
| 6,887,716 B2 | 5/2005 | Fox et al. | |
| 6,889,920 B2 | 5/2005 | Nance et al. | |
| 6,936,837 B2 | 8/2005 | Yamada et al. | |
| 6,943,485 B2 | 9/2005 | Sumi | |
| 6,969,157 B2 | 11/2005 | Tomozawa et al. | |
| 7,120,978 B2 | 10/2006 | Wasa et al. | |
| 7,153,705 B2 | 12/2006 | Maruyama et al. | |
| 7,166,954 B2 | 1/2007 | Miyazawa et al. | |
| 7,185,540 B2 | 3/2007 | Torii et al. | |
| 7,193,756 B2 | 3/2007 | Murata et al. | |
| 7,196,457 B2 | 3/2007 | Miyazawa et al. | |
| 7,197,799 B2 | 4/2007 | Higuchi et al. | |
| 7,214,977 B2 | 5/2007 | Kijima et al. | |
| 7,215,067 B2 | 5/2007 | Ifuku et al. | |
| 7,229,662 B2 | 6/2007 | Wang et al. | |
| 7,240,409 B2 | 7/2007 | Sumi et al. | |
| 7,247,551 B2 | 7/2007 | Higuchi et al. | |
| 7,247,975 B2 | 7/2007 | Tochi et al. | |
| 7,254,877 B2 | 8/2007 | Murai | |
| 7,262,544 B2 | 8/2007 | Aoki et al. | |
| 7,265,483 B2 | 9/2007 | Takeda et al. | |
| 7,268,472 B2 | 9/2007 | Higuchi et al. | |
| 7,279,823 B2 | 10/2007 | Higuchi et al. | |
| 7,279,825 B2 | 10/2007 | Ifuku et al. | |
| 7,287,840 B2 | 10/2007 | Miyazawa et al. | |
| 7,291,520 B2 | 11/2007 | Murai | |
| 7,291,530 B2 | 11/2007 | Nakagawa et al. | |
| 7,291,959 B2 | 11/2007 | Miyazawa et al. | |
| 7,291,960 B2 | 11/2007 | Iwashita et al. | |
| 7,298,018 B2 | 11/2007 | Ezhilvalavan et al. | |
| 7,303,828 B2 | 12/2007 | Kijima et al. | |
| 7,309,950 B1 | 12/2007 | Aoki et al. | |
| 7,310,862 B2 | 12/2007 | Higuchi et al. | |
| 7,312,558 B2 | 12/2007 | Fujii et al. | |
| 7,320,163 B2 | 1/2008 | Xin-Shan et al. | |
| 7,328,490 B2 | 2/2008 | Murai et al. | |
| 7,339,219 B2 | 3/2008 | Kondo et al. | |
| 7,343,654 B2 | 3/2008 | Xin-Shan | |
| 7,348,715 B2 | 3/2008 | Tori et al. | |
| 7,350,904 B2 | 4/2008 | Noguchi et al. | |
| 7,368,172 B2 | 5/2008 | Kondo et al. | |
| 7,423,308 B2 | 9/2008 | Kurasawa | |
| 7,427,515 B2 | 9/2008 | Kondo et al. | |
| 7,446,361 B2 | 11/2008 | Maruyama | |
| 7,478,558 B2 | 1/2009 | Fujii et al. | |
| 7,513,608 B2 | 4/2009 | Aoto et al. | |
| 7,521,845 B2 | 4/2009 | Ifuku et al. | |
| 7,535,157 B2 | 5/2009 | Saito | |
| 7,547,933 B2 | 6/2009 | Takamatsu et al. | |
| 7,562,968 B2 | 7/2009 | Sumi et al. | |
| 7,568,792 B2 | 8/2009 | Takabe et al. | |
| 7,579,041 B2 | 8/2009 | Kuriki et al. | |
| 7,589,450 B2 | 9/2009 | Takabe et al. | |
| 7,608,981 B2 | 10/2009 | Unno et al. | |
| 7,614,128 B2 | 11/2009 | Kamei | |
| 7,618,131 B2 | 11/2009 | Wasa et al. | |
| 7,622,850 B2 | 11/2009 | Iwashita et al. | |
| 7,622,852 B2 | 11/2009 | Ifuku et al. | |
| 7,646,073 B2 | 1/2010 | Hamada | |
| 7,651,199 B2 | 1/2010 | Takabe et al. | |
| 7,652,408 B2 * | 1/2010 | Fujii | 310/311 |
| 7,708,289 B2 | 5/2010 | Jaime, Sr. | |
| 7,712,878 B2 | 5/2010 | Takabe et al. | |
| 7,717,546 B2 | 5/2010 | Noguchi et al. | |
| 7,725,996 B2 | 6/2010 | Li et al. | |
| 7,768,050 B2 | 8/2010 | Rappe et al. | |
| 7,768,178 B2 | 8/2010 | Fujii et al. | |
| 7,785,659 B2 | 8/2010 | Nihei | |
| 7,786,656 B2 | 8/2010 | Sakashita et al. | |
| 7,786,964 B2 | 8/2010 | Sakashita | |
| 7,804,231 B2 | 9/2010 | Ifuku et al. | |
| 7,810,915 B2 | 10/2010 | Takabe et al. | |
| 7,816,842 B2 | 10/2010 | Naono et al. | |
| 7,819,508 B2 | 10/2010 | Kuriki et al. | |
| 7,827,658 B2 | 11/2010 | Li | |
| 7,830,073 B2 | 11/2010 | Sakashita | |
| 7,837,305 B2 | 11/2010 | Hara | |
| 7,956,369 B2 | 6/2011 | Reed et al. | |
| 2003/0129307 A1 * | 7/2003 | Lu et al. | 427/255.28 |
| 2004/0155559 A1 * | 8/2004 | Ifuku et al. | 310/328 |
| 2008/0083452 A1 * | 4/2008 | Morooka et al. | 136/252 |
| 2010/0006780 A1 | 1/2010 | Metcalfe et al. | |

OTHER PUBLICATIONS

P. Muralt. "Texture Control and Seeded Nucleation of Nanosize Structures of Ferroelectric Thin Films," J. Appl. Phys. 100, 051605 (2006).

Hiboux, S, et al., "Orientation and Composition Dependence of Piezoelectric Dielecfric Properties of Sputiered Pb(Zr x,Ti (1-x))O3 Thin Films," Materials Research Society, Met. Res. Sec. Symp. Proc. (2000) p. 499.

Seifert, A., et al. "Processing Optimization of Solution Derived PbZr(1-x)Ti(x)O3 Thin Films for Piezoelectric Applications," Integrated Ferroelectrics, (2001) vol. 35, pp. 159-166.

F.K. Lofgering, "Topotactical reactions with ferrimagnetic oxides having hexagonal crystal structures—I" Philips Research Laboratories, N. V. Philips' Gloeilampenfabrieken, Eindhoven, Netherlands, Journal of Inorganic and Nuclear Chemistry vol. 9, Issue 2, Feb. 1959, pp. 113-123.

Hiratani, M., "Ultra-thin Titanium oxide Film with a Rutile-type structure," Appl. Surf. Science 207, pp. 13-19 (2003).

Muralt, P., et al., "Fabrication and characterization of PZT thin-film vibrators for micromotors," Sensors and Actuators A 48 (1995) p. 157.

Troiler-McKinstrey et al., "Thin Film Piezoelectrics for MEMS" Journal of Electroceramics, 12, 7-17, (2004).

Sanchez, Luz, et al. "Improving PZT Thin Film Texture Through Improved Pt Metallization and Seed Layers" poster exhibited at University of Maryland ResearchFest poster exhibition, Feb. 18, 2010.

Sanchez, Luz, et al. "Improving PZT Thin Fiim Texture Through Improved Pt Metallization and Seed Layers" Abstract submitted to University of Maryland Feb. 16, 2010. Available on line: date unknown.

Troiler-McKinstrey et al., "Improved Thin Film Piezoelectrics for Actuator Applications" The Pennsylvania State University, Office of Sponsored Programs, 110 Report Number Technology Center Building, University Park, PA 16802 Final process rept. Apr. 1-Dec. 31, 2007.

Q.Q. Zhang, et al, "Lead zirconate titanate films for d33 mode cantilever actuators,"Sensors and Actuators A 105 (2003) 91-97.

M.D. Vaudin, et el., "Accuracy and Reproducibility of X-ray Texture Measurements on Thin Films," Mat. Res. Soc. Symp. Proc, vol. 721, entitled "Magnetic and Electronic Films-Microstructure, Texture and Application to Data Storage," edited by P.W. DeHaven et al. (Mat Res. Soc., Warrendale PA, 2002) pp. 17-22.

T. Maeder, et al, "Stabilized Pt Electrodes for Ferroelectric Flim Deposition Using Ti, Ta, and Zr Adhesion Layers," Japan. J. Appt. Phys., 37, 2007 (1998).

Muralt. P., "Texture control of PbTiO3 and Pb(Zr,Ti)O3 thin films with TiO2 seeding", Journal of Applied Physics, vol. 83, No. 7 (Apr. 1, 1998) p. 3835.

Nicolas Ledermann, et al. "{1 0 0}—Textured, piezoelectric Pb(Zrx, Ti1—χ)O3 thin films for MEMS:integration, deposition and properties," Sensors and Actuators A 105 (2003) 162-170.

(56) References Cited

OTHER PUBLICATIONS

Hiboux, H., et al. "Mixed titania-lead oxide seed layers for PZT growth on Pt(111):a study on nucleation, texture and properties," Journal of the European Ceramic Society 24 (2004) 1593-1596.
F. Tyholdt, et al. "Chemically derived seeding layer for {100}— textured PZT thin films," J Electroceram (2007) 19:311-314 DOI 10.1007/s10832-007-9037-2.
Dubois, et al , "Which PZT Thin Films for Piezoelectric Microactuator Applications?" Integrated Ferroelectrics vol. 22 . pp. 535 543 (1998).
Taylor, D., et al., "Piezoelectric properties of rhombohedral Pb(Zr,Ti)O3 thin films with (100),(111), and "random" crystallographic orientation," Appl. Phys. Lett. 76, 1615 (2000); doi: 10.1063/1.126113.
Maeder, T., "Thin Films by In-situ Reactive Sputtering on Micromachined Membranes for Micromehanical Applications," British Ceramic Proceedings, Issue 54, 1996, pp. 206-218.
Matsumoto, T., "Development of Pt/MgO(100) Buffer Layers for Orientation Control of Perovskite Oxide Thin Films," Japanese Journal of Applied Physics vol. 47, No. 9, 2008, pp. 7565-7569.

* cited by examiner

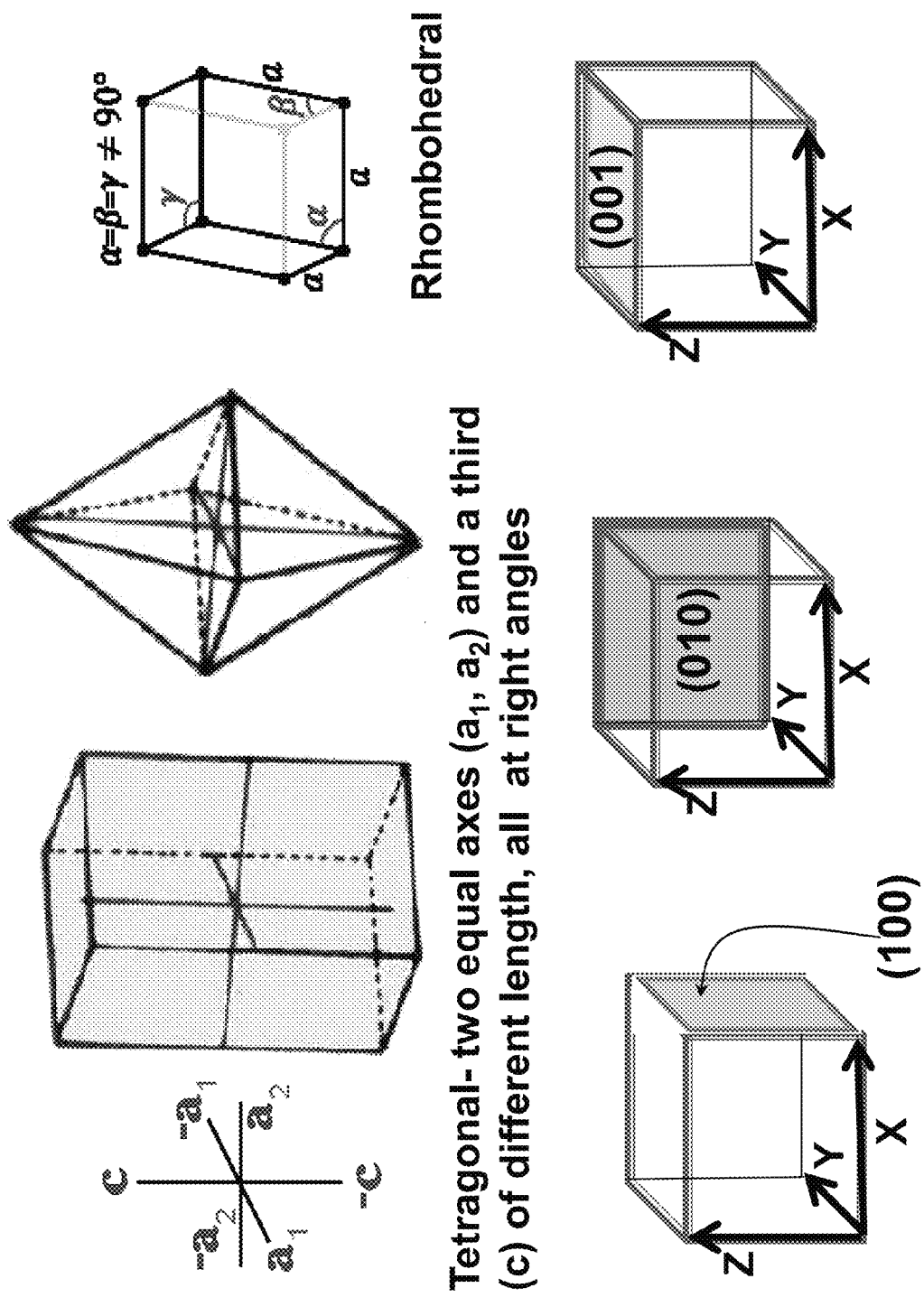
FIG. 1A  ORIENTATIONS AND CRYSTAL STRUCTURES

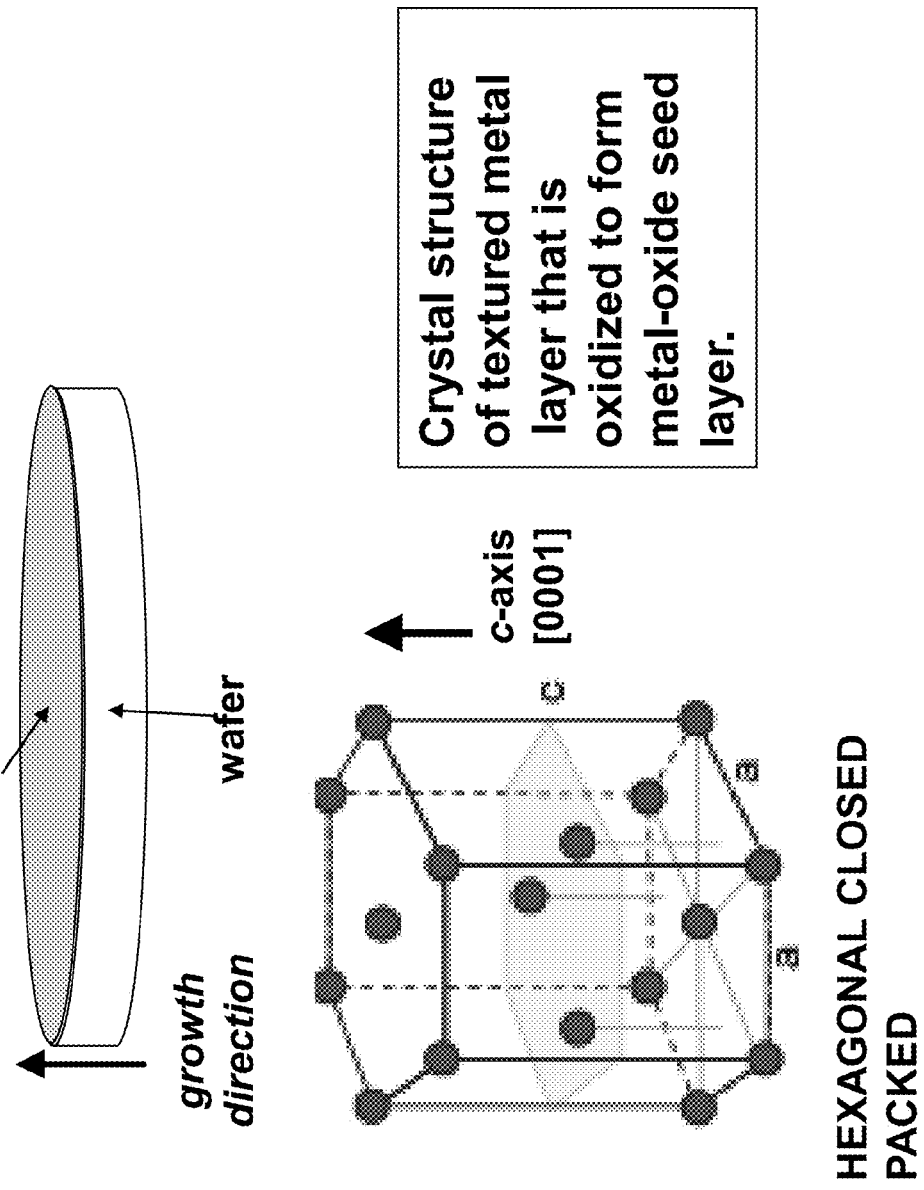

XIIA2+VIB4+X2-3 with the oxygen in the face centers.

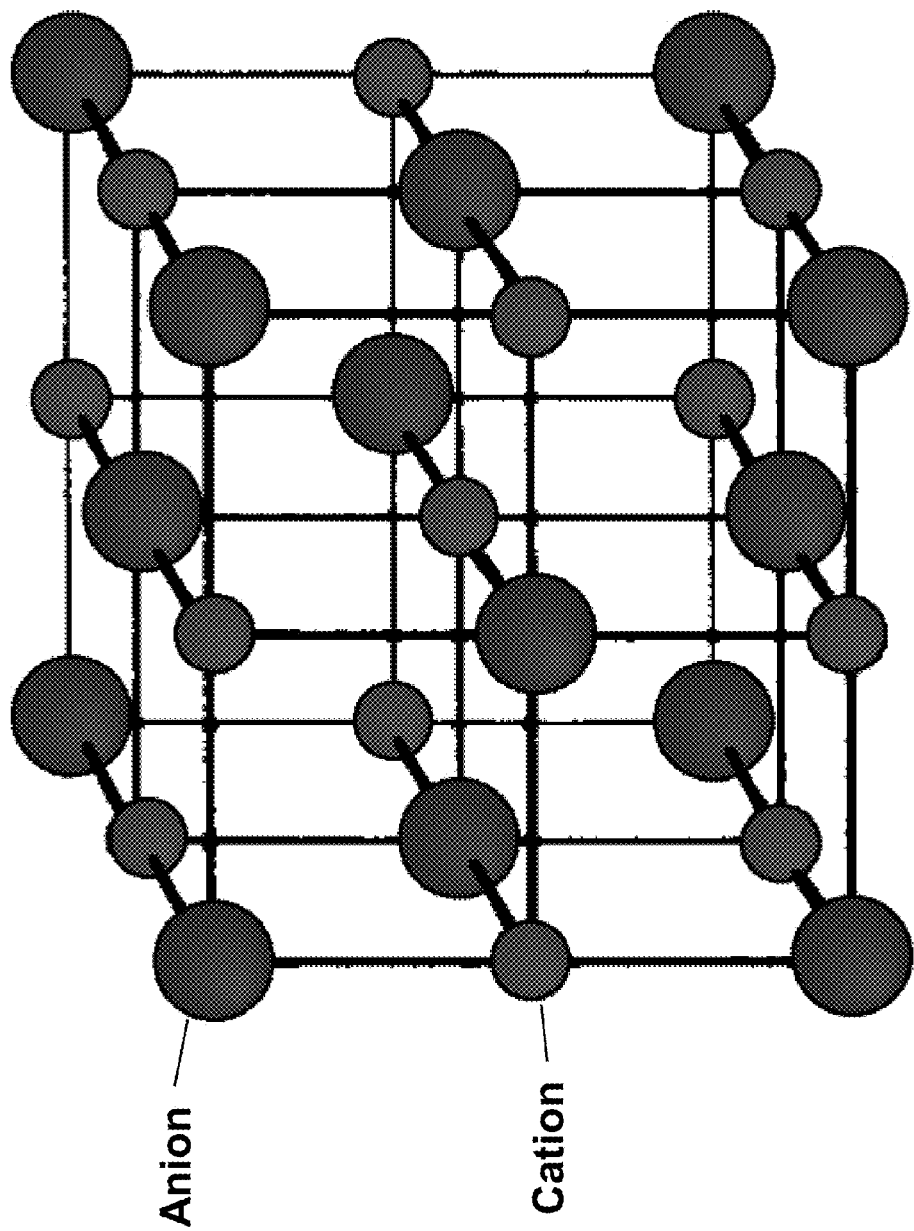
FIG 1D. Illustration of the rocksalt crystal structure.

FIG. 3 - Ti HCP Basal Plane

FIG. 6 - Pt (111) on Rutile (100)

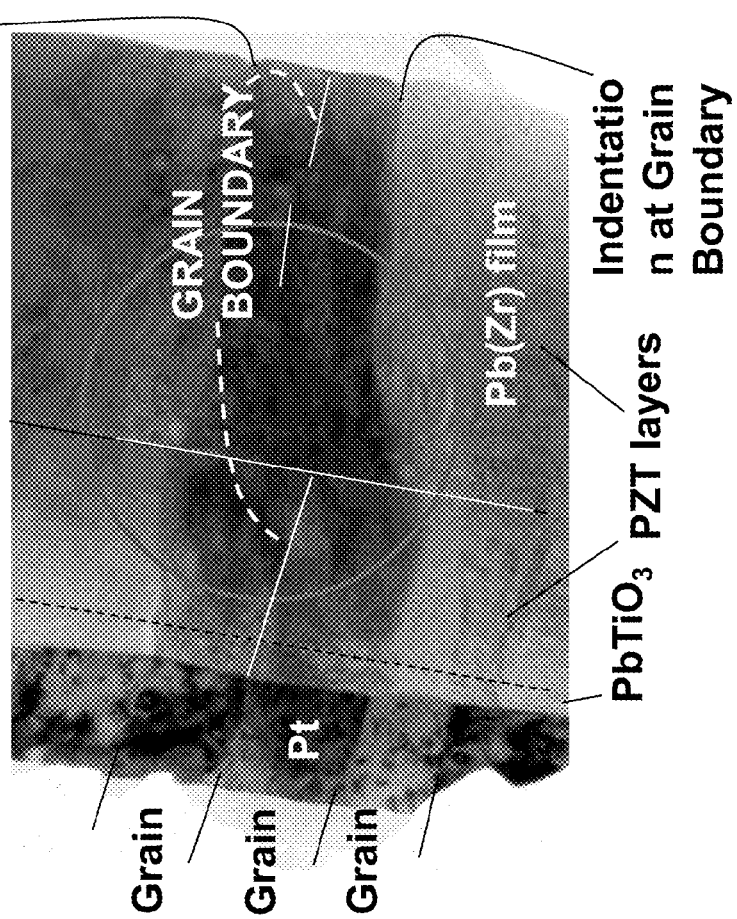

FIG. 16   Textured metal deposition

FIG. 17 - Mg HCP Basal Plane

3.20936 Å

Mg = 1.60 Å

FIG. 19 - MgO (100) Plane

FIG. 21 - Pt (100) on MgO (100)

THERMALLY OXIDIZED SEED LAYERS FOR THE PRODUCTION OF {001} TEXTURED ELECTRODES AND PZT DEVICES AND METHOD OF MAKING

CROSS-REFERENCE TO RELATED APPLICATIONS

This application claims priority to U.S. Provisional Application No. 61/547,879 entitled "Thermally Oxidized Seed Layers for the Production of {001} Textured Electrodes and PZT Capacitors" by Fox, et al filed on Oct. 17, 2011, hereby incorporated by reference. This application is also a continuation-in-part (CIP) of U.S. patent application Ser. No. 13/436,349 entitled "Stylo-Epitaxial Piezoelectric and Ferroelectric Devices and Method of Manufacturing," filed Mar. 30, 2012, which claims priority to U.S. Provisional Application No. 61/547,990 entitled "Stylo-Epitaxial Piezoelectric and Ferroelectric Devices and Method of Manufacturing," filed by Fox, et al. on Oct. 17, 2011, both of which are hereby incorporated by reference.

STATEMENT OF GOVERNMENT INTEREST

The embodiments herein may be manufactured, used, and/or licensed by or for the United States Government without the payment of royalties thereon.

BACKGROUND OF THE INVENTION

A wide variety of the physical properties of materials, such as ferroelectricity, ferromagnetism, piezoelectricity, conductivity, and dielectric permittivity depend upon material anisotropy and are therefore strongly affected by crystallographic texture, as reported in M. D. Vaudin, et al., "Accuracy and Reproducibility of X-ray Texture Measurements on Thin Films," Mat. Res. Soc. Symp. Proc., Vol. 721, entitled "Magnetic and Electronic Films-Microstructure, Texture and Application to Data Storage," edited by P. W. DeHaven et al. (Mat. Res. Soc., Warrendale Pa., 2002) pp. 17-22. With the appropriate choice of thin film texture, device operating efficiency and reliability can be strongly affected. Therefore, texture is a critical factor for thin film process control and is fundamental to device reproducibility Microelectromechanical systems (MEMS) have been used in a wide range of applications, for example, from pressure sensors and accelerometers to microphones and digital displays. In 2006, STMicroelectronics and Nintendo revolutionized the entire MEMS industry through the launch of the Nintendo Wii gaming console that uses 3-D MEMS accelerometers for motion control. Since then, MEMS devices have been used in almost all new technology from smart phones to tablet PCs. In 2010, the MEMS industry experienced a 25% growth with the top four MEMS suppliers, Texas Instruments, Hewlett-Packard, Robert Bosch, and STMicroelectronics, increasing MEMS sales by 37%. Years of materials research has led to the current progress in MEMS technology. Various journal articles and books that have been written on piezoelectric thin films, one of the types of materials used in MEMS devices for micro-scale actuation Lead zirconate titanate (Pb $(Zr_x Ti_{1-x})O_3$ or PZT) exhibits piezoelectric properties in thin films and is the most widely used piezoelectric bulk ceramic with ferroelectric properties. Examples of the use of thin films of PZT (used to create large force, large displacement actuators) include actuators for RF switches, relays and inkjet print heads.

The piezoelectric coefficient of PZT is inherently linked to its crystalline quality. The crystallographic texture of lead zirconate titanate (PZT) thin films strongly influences the piezoelectric properties used in MEMS applications. For tetragonal phase PZT films poled to saturation, the piezoelectric response is sequentially greater for random, {111}, and {001} texture. Textured growth can be achieved by relying on crystal growth habit and can also be initiated by the use of a seed layer that provides a heteroepitaxial template. Template choice and the process used to form it determine the structural quality and ultimately influence performance and reliability of PZT MEMS devices such as switches, filters, and actuators. {111}-textured PZT is generated by a combination of crystal habit and templating mechanisms that occur in the PZT/bottom-electrode stack.

The highest magnitude piezoelectric coefficients are observed at the PZT morphotropic phase boundary (MPB), where the crystal structure changes abruptly between the tetragonal and rhombohedral symmetry. At the MPB, the dielectric permittivity and piezoelectric coefficients reach a maximum. The MPB is located approximately at $PbZr_{0.52}Ti_{0.48}O_3$, or PZT (52/48), composition. In thin film form, the composition and the crystalline texture must be controlled to achieve the maximum piezoelectric coefficients. For PZT (52/48), the highest coefficients are reported for a {001} textured PZT (52/48). The increased piezoelectric response and poling efficiency near to $x=0.52$ is due to the increased number of allowable domain states at the MPB. At this boundary, the 6 possible domain states from the tetragonal phase <100> and the 8 possible domain states from the rhombohedral phase <111> are equally favorable energetically, thereby allowing a maximum 14 possible domain states.

To date, two approaches have been taken to produce PZT thin film devices with the spontaneous polarization normal to the plane of the film and thus normal to the planar capacitor device, i.e. {001}-orientation. It is noted that directions in crystal lattices are defined in terms of directions l, m, and n, known as the Miller indices. Indices {l,m,n}, {100}, {010} and {001} represent planes orthogonal (normal) to the l, m, and n directions, respectively. The crystallographic directions are lines linking nodes (atoms, ions or molecules) of a crystal. Similarly, the crystallographic planes are planes linking nodes. Some directions and planes have a higher density of nodes; these dense planes have an influence on the behavior of the crystal. The notation {001} denotes the set of all planes that are equivalent to (001) (as shown in FIG. 1A) by the symmetry of the lattice. Heteroepitaxial growth makes use of a crystal substrate to initiate growth of an overlying crystalline material that has a different crystal structure than the substrate. Either a polar or a non-polar substrate may be used to initiate growth of a polar film. Further discussion of spontaneous polarization is found in FIG. 8 of U.S. Patent Application Publication No. 2010/0006780 and U.S. Pat. No. 7,956,369.

The first approach to producing PZT thin film devices with the spontaneous polarization normal to the plane of the film is to use a single crystal substrate and grow epitaxial layers of the bottom electrode and ferroelectric layer. The difficulty with this approach is that it places very strict requirements on the single crystal substrate, and the electrode must provide an epitaxial relationship with both the single crystal substrate and the ferroelectric film. The second approach to obtaining {001}-orientation is to use a seed layer and/or variations in process conditions to produce a {001}-textured PZT film whereby the PZT {001}-planes lie parallel to the substrate plane, but the relative orientations of the grains are randomly rotated about the substrate normal having no defined crystallographic role in the relationship between the substrate, capacitor electrodes and the PZT.

An alternative approach proven to obtain highly {001}-textured polycrystalline PZT films with enhanced piezoelectric coefficients is to use a PbTiO$_3$ (PT) seed layer on the surface of a {111} textured Pt electrode. Unfortunately, such seed layers introduce composition gradients that cause a reduction in the reliability properties including polarization-retention and polarization-cycling endurance. When a seed layer such as PbTiO$_3$ (PT) is used on the surface of the bottom electrode, annealing conditions, PZT texture, composition, and optimization of the piezoelectric properties are interdependent and cannot be altered independently.

In U.S. Pat. No. 6,682,772 to Fox entitled "High temperature deposition of Pt/TiO$_x$ for bottom electrodes," hereby incorporated by reference, there is disclosed a platinum deposition method that uses a combination of an oxide adhesion layer and a high temperature thin film deposition process to produce platinum bottom electrodes for ferroelectric capacitors. TiO$_x$ was deposited on thermally grown SiO$_2$ on a Si wafer. The platinum bottom electrode was deposited onto a TiO$_x$ layer at temperatures between about 300 and 800° C. Deposition at high temperatures changes the platinum stress from compressive to tensile, increases platinum grain size, and provides a more thermally stable substrate for subsequent PZT deposition.

Previous publications and patents do not provide a complete description of the {001}-textured PZT. It is insufficient to state independently just the percentage of {100}-textured grains or {001}-textured grains or angular distribution width of the textured grains. In order to fully define a texture and in the present case the crystallographic efficiency (or figure of merit) of the PZT film, the volume fraction of the {100}-oriented grains relative to the total volume of the PZT film must be defined. Of the {100} volume fraction, the volume fraction of the {001}-oriented grains must be defined. Finally, the misalignment distribution of the {001}-oriented grains relative to the substrate normal (which is also the electric field direction of the device) must be defined. When these crystallographic parameters are defined, a figure-of-merit for the material can be calculated.

SUMMARY OF PRESENT INVENTION

One embodiment of the present invention comprises crystallographically textured, thermally oxidized, metal thin films used as a template to seed growth of crystallographically textured metal electrodes relative to the substrate growth plane (FIG. 1B). The textured metal electrodes may in turn act as a seed layer for the growth of, for example, perovskite structure (FIG. 1C), {001}-textured PZT, which is the desired crystallographic orientation for optimized piezoelectric and ferroelectric device performance.

Another embodiment comprises oxide seed layers exhibiting a rocksalt crystal structure. As used herein, the terminology rocksalt structure refers to a type of ionic crystal structure in which the cations have a face-centered cubic arrangement, with anions occupying all the octahedral holes, from another perspective, a face centered cubic array of anions with cations in the octahedral holes, as shown in FIG. 1D. The rocksalt structure, metal-oxide, {100}-textured thin films provide seeding templates for growth of {100}-textured Pt, Ir, Au, Pd, Ru, Ag, Cu, Ni, and other face-centered-cubic (FCC) electrode metals compatible with PZT thin film growth as well as other perovskite structure thin films such as PbTiO$_3$, (PbLa)TiO$_3$, SrTiO$_3$, BaTiO$_3$, PbNiNbO$_3$, Pb(ZrTi)O$_3$, PbYbNbO$_3$, PbScTaO$_3$(Ba$_{1-x}$Sr$_x$)TiO$_3$, Pb(Mg$_{1/3}$Nb$_{2/3}$)O$_3$, Pb(ZnNb)O$_3$, PbYbNbO$_3$ and combinations thereof.

One aspect of this invention is that it uses a crystallographically textured metal thin film with a thickness of 1 nm to 50 nm, which is converted to a textured metal-oxide by thermal oxidation. For example, one embodiment comprises a Mg metal film grown by vapor deposition, which grows with a hexagonal-close-packed crystal structure with a {0001}-texture. When the {0001}-textured Mg film is annealed in an oxygen-containing environment, the metal oxidizes and is converted to {100}-textured MgO with the rocksalt structure. With this embodiment processing method, the MgO/Mg system is self-seeding and relies on thermodynamically stable oxidation states and crystal habits when considering the growth conditions of the film. The concepts of the invention can be extended to any metal-oxide/metal seed layer system that can provide a good epitaxial match for the growth of Pt or related electrode materials such as Ir, Au, Pd, Ru, Ag, Cu, Ni. For example, the approach can be applied to MgO, CaO, SrO, NiO, FeO, ScO, VO, CrO, CoO, MnO, CuO, SrO, NbO, PdO, CdO, BaO, SmO, and RaO etc. It could also be used to achieve electrode crystallographic textures other than the {100}-texture.

Some advantages of using the inventive thermally oxidized metal seed layers include: 1) the system is self-seeding i.e. there is no need for an additional seed layer containing other elements, 2) only a single source material and deposition method is required to obtain the metal thin film, 3) metal thin films typically grow with natural textures at temperatures below 600° C. which is readily achievable in production thin film deposition tools, 4) The oxidation process can be completely separated from the deposition process such that higher temperature anneal processes can be completed in an oven instead of the metal deposition tool, and 5) both the metal thin film deposition process and the oxidation processes can be used to tune the physical structure of the seed layer to obtain optimal texturing of the overlying electrode and PZT films.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

All patents, patent application, and other references mentioned herein are hereby incorporated by reference in their entireties.

BRIEF DESCRIPTION OF THE DRAWINGS

The embodiments herein will be better understood from the following detailed description with reference to the drawings, in which:

FIG. 1A is a diagrammatic illustration of crystal planes, planar orientations and crystal structures.

FIG. 1B shows the orientation of the c-axis of a hexagonal-close-packed crystal's structure (with c-axis being defined as perpendicular to the c-plane) relative to the growth plane, which in this example is the sample surface.

FIG. 1D is a diagrammatic illustration of the rocksalt crystal structure.

FIG. 13 is TEM cross-section image showing the granular PZT layer in registration with the granular $PbTiO_3$ layer in registration with the granular Pt layer in registration with the granular $TiO_2$ layer.

FIG. 14 is a selected area electron diffraction pattern of two (001)-oriented PZT grains separated by a low angle grain boundary resulting from a small angle rotation of one grain with respect to the other grain.

DETAILED DESCRIPTION OF PREFERRED EMBODIMENTS

Figure 1C:
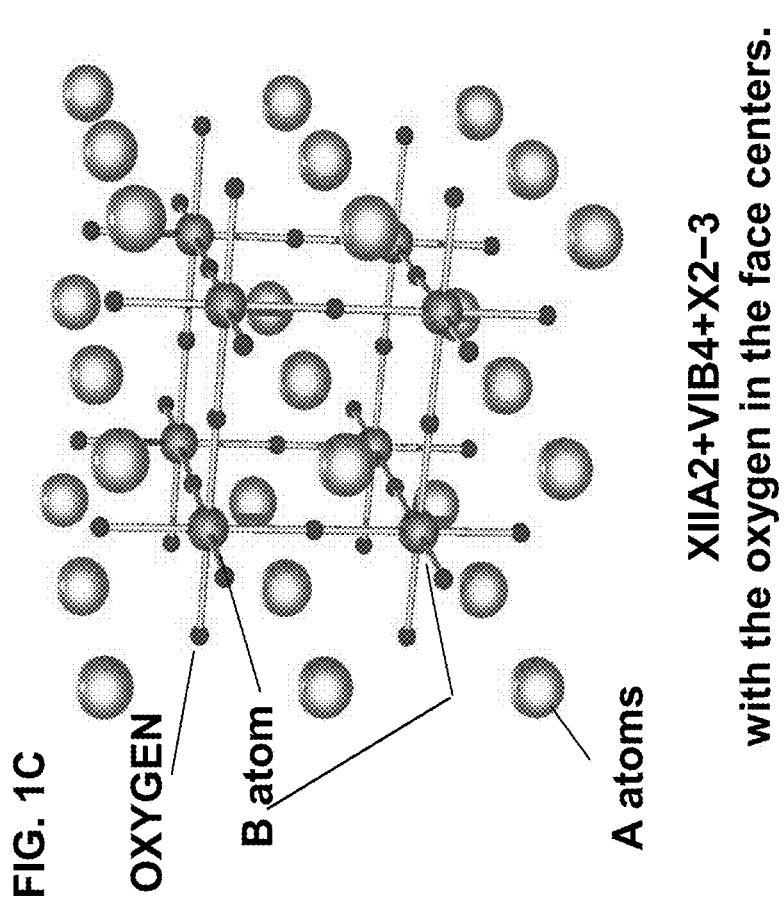
FIG. 1C is a diagrammatic illustration of the perovskite crystal structure.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. For example, if one layer is "formed above" another, intervening layers may be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. The layers and/or regions illustrated in the figures are schematic in nature and their shapes are not intended to illustrate the precise shape of a region of a device and are not intended to limit the scope of the present invention. The layers are not drawn to relative scale. Moreover, variations from the shapes are to be expected. Thus, embodiments of the present invention should not be construed as limited to the particular shapes of regions illustrated herein but are to include deviations in shapes. For example, a region illustrated as a rectangle may have a variety of configurations without deviating from the present invention and/or may have tapered, rounded or curved features.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Metal oxide single crystals exhibiting the rocksalt structure, e.g. MgO, CaO, and NiO provide good epitaxial substrates for the growth of (100) Pt thin films when the substrate crystal is cut to provide a (100) substrate plane. In addition, it has been demonstrated that {100}-textured MgO films can provide a seed layer for {100}-textured Pt thin films. In order to obtain a {100}-textured seed layer such as MgO on Si and $SiO_2$/Si substrates, other researchers have used a seed layer, such as Fe, to initiate the textured growth of the MgO. In addition, reactive sputter deposition of MgO at high substrate temperatures, greater than 600° C., has been used to deposit the textured MgO films upon which {100}-textured Pt is grown. The disadvantages of these methods for obtaining {100}-textured Pt electrodes include, 1) the requirement for an additional seed layer, such as Fe, that requires an extra source material and deposition step, and 2) high in-situ deposition temperatures that often require specialized equipment that is not typically available in production deposition tools.

It is known that lead zirconate titanate [$Pb(Zr_xTi_{1-x})O_3$, PZT, exhibits piezoelectric properties. Materials with these properties are used to create large force, large displacement actuators and sensors. PZT is one of the most economical ceramics that exhibits a high piezoelectric coefficient allowing for the use of lower voltages to achieve the same actuator performance metrics. It is highly desired to achieve highly {001} textured PZT (52/48). Proper control of the crystalline texture will allow an increase in the piezoelectric stress constant as shown by N. Ledermann, et. al. "Textured, piezoelectric $Pb(Zr_xTi_{1-x})O_3$ thin films for MEMS: integration, deposition, and properties." Sensors and Actuators A 105, 162 (2003), with random order PZT (52/48) $-e_{31,f}o\sim7$ $C/m^2$ and (100) oriented PZT (52/48) exhibiting 12 $C/m^2$, close to 60%. Enhanced (100) oriented PZT will result in substantial improvements in device performance including lower actuation voltages, higher force actuation, and lower power consumption. Through the use of a sol-gel derived $PbTiO_3$ seed layer based on the work of Paul Muralt et al. "Texture Control of $PbTiO_3$ and $Pb(Zr,Ti)O_3$ Thin Films with $TiO_2$ Seeding." Journal of Applied Physics 83.7 3835-3841 (1998), highly oriented (001) PZT can be obtained with increased piezoelectric properties using a combination of optimal processing conditions for the solution chemistry, platinum (Pt) electrode texture, and rapid thermal annealing (RTA) conditions of the PZT thin films.

The piezoelectric coefficient of PZT is inherently linked to its crystalline quality and composition. The highest magnitude piezoelectric coefficients are observed at the PZT morphotropic phase boundary (MPB), where the crystal structure changes abruptly between the tetragonal and rhombohedral symmetry. At the MPB, the dielectric permittivity and piezoelectric coefficients reach a maximum. The MPB is located approximately at $PbZr_{0.52}Ti_{0.48}O_3$, or PZT (52/48), composition.

The crystallographic texture of PZT thin films strongly influences the piezoelectric properties used in MEMS applications. When PZT films are poled to saturation, the piezoelectric response increases sequentially on transforming from random orientation to {111} texture to {001} texture. Textured growth can be achieved by relying on crystal growth habit, but it can also be initiated by the use of a seed layer that provides a heteroepitaxial template. The choice of template and the process used to form it determines the structural quality and ultimately influences performance and reliability of MEMS PZT devices such as switches, filters, and actuators. PZT {111}-texture can be generated by taking advantage of a combination of crystal habit and templating mechanisms that occur in the PZT/bottom electrode stack. In order to achieve a highly defined {111}-textured PZT the process sequence, use of seed layers and compatibility of electrode material must be carefully chosen. The process and material layer sequence may, for example, begin with {0001}-textured Ti (FIGS. 2 and 3 deposited on PECVD or thermally grown SiO$_2$ on a Si wafer. The Ti is then converted to {100}-textured TiO$_2$ with the rutile structure (FIG. 4) through thermal oxidation and then {111}-textured Pt (FIGS. 5 and 6) can be grown on top of the {100}-textured TiO$_2$. The {111}-textured Pt acts as a template for {111}-textured PZT (FIG. 7) growth. The Ti and Pt are deposited by DC magnetron sputtering although other vapor deposition methods such as evaporation or metalorganic chemical vapor deposition can be used. Optimization of the TiO$_2$ and Pt film crystallographic textures and structures have been studied by variation of sputtering deposition times, temperatures and power levels, anneal conditions and substrate surface roughness. The correlations between the TiO$_2$ {100}-texture and the Pt {111}-texture and the Ti {0001}-texture and Pt {111}-texture qualities are illustrated by the results given in FIGS. 8 and 9, respectively.

Although {111}-textured PZT is produced when grown directly on {111}-textured Pt it is possible to induce the growth of {001}-textured PZT by placing seed layers at the PZT/Pt interface, Orientation control of lead zirconate titanate (PZT) thin films exhibiting a high degree of (001)-texture is desirable due to improved polarization and piezoelectric response. One known means proven to obtain highly {001}-textured polycrystalline PZT films with enhanced piezoelectric coefficients is to use a PbTiO$_3$ seed layer on the surface of the bottom Pt electrode. Unfortunately, such seed layers introduce composition gradients that cause a reduction in the magnitude of the ferroelectric spontaneous polarization, piezoelectric coefficients and reliability properties including polarization retention and cycling endurance. When a seed layer such as PbTiO$_3$ (PT) is used on the surface of the bottom electrode, annealing conditions, PZT texture, composition, and optimization of the piezoelectric properties are interdependent and cannot be altered independently.

The detrimental effects on the ferroelectric and piezoelectric properties of PZT due to the use of a PbTiO$_3$ seed layer can be minimized by employing a process resulting in a stylo-epitaxial structure. Formation of a stylo-epitaxial structure allows the {001}-texture of the PZT to be maximized, which is desirable, while it minimizes the composition gradients and electrode/PZT interface defects that detrimentally affect the device performance.

Figure 10:
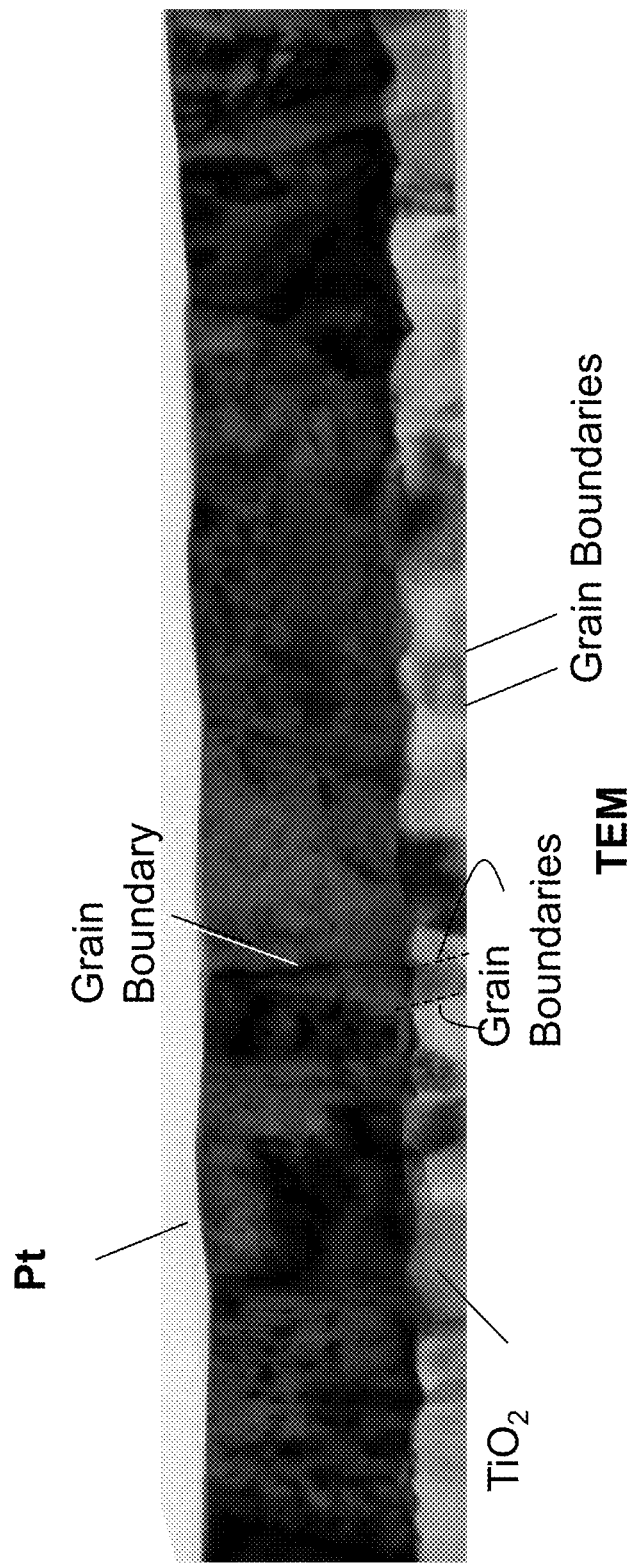
FIG. 10 is a TEM cross-section image showing the granular Pt layer in registration with the granular $TiO_2$ layer.
Figure 11:
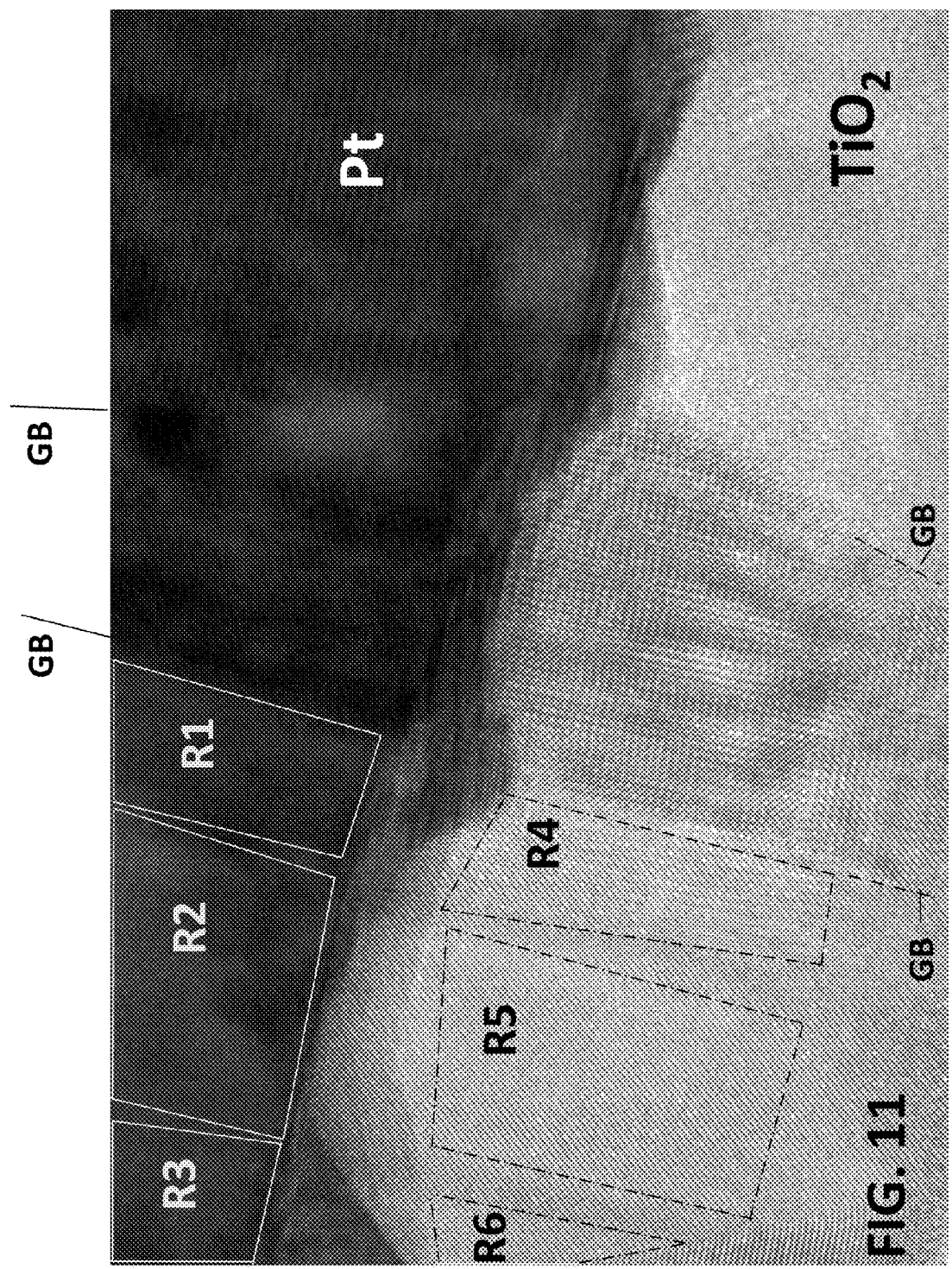
FIG. 11 is an illustration showing an enlargement of the regions shown in FIG. 10.
Figure 12:
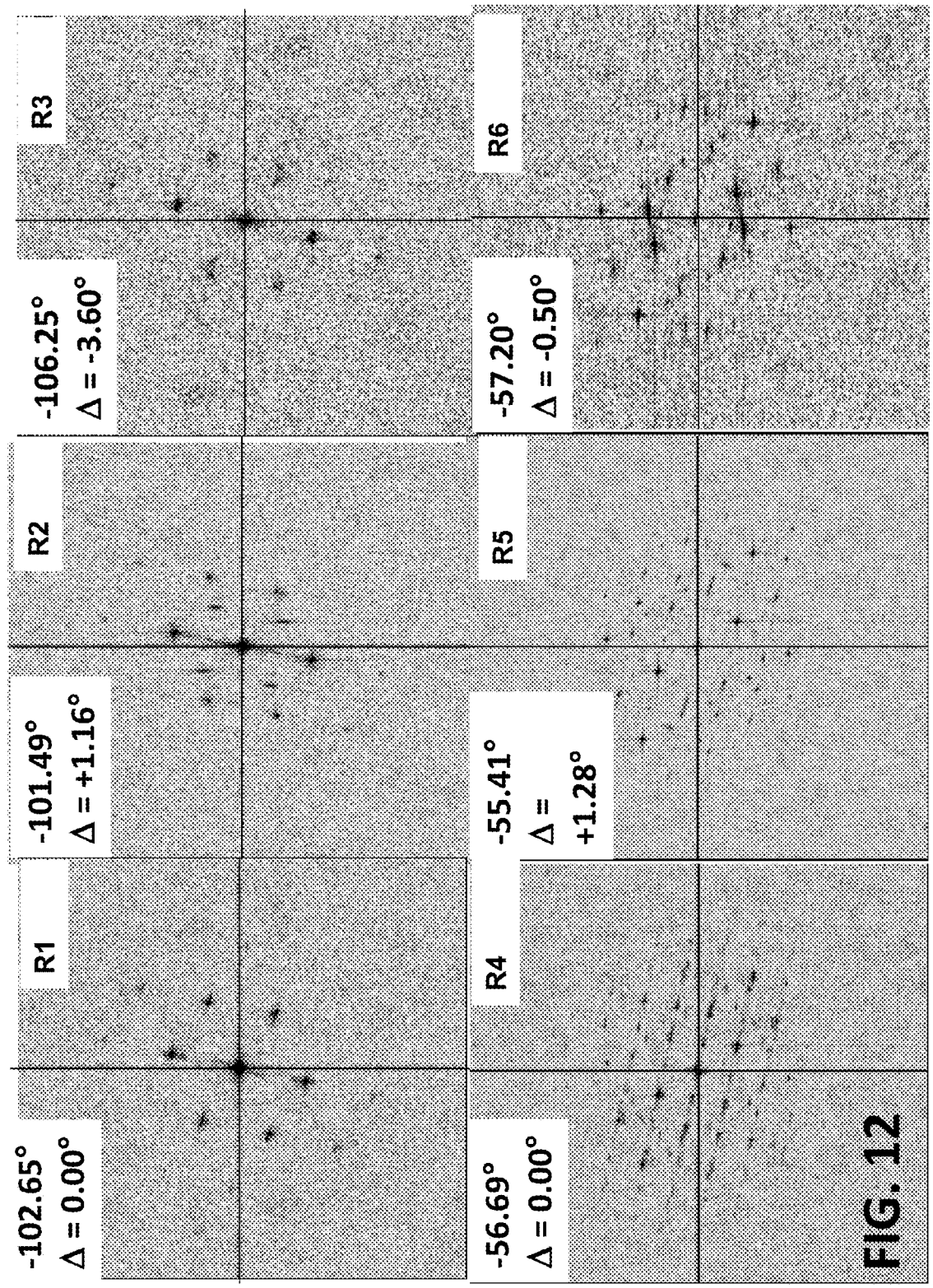
FIG. 12 is an illustration representing the Fast Fourier Transforms and relative angular rotations of the regions R1 to R6 of the FIG. 11.
Figure 15:
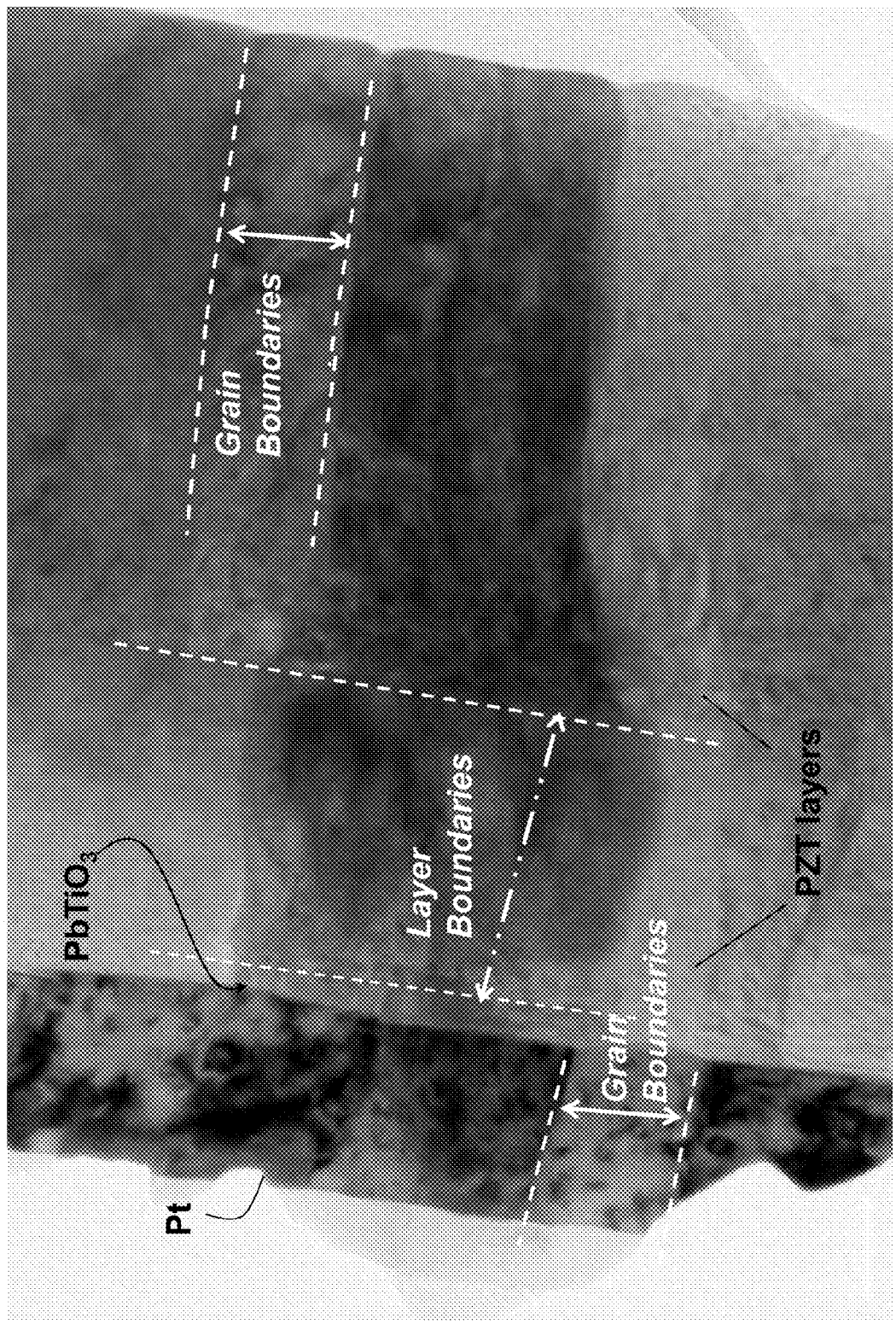
FIG. 15 is an enlarged view of FIG. 13.

A comparison of PZT capacitor devices that exhibit stylo-epitaxy with those that do not exhibit stylo-epitaxy is provided in the following experimental results that use varying types of Pt electrodes. Ti/Pt and TiO$_2$/Pt thins films were used as the base electrode for sol-gel PZT thin film growth (with silicon substrates and a 500 nm thermally grown silicon dioxide). The PZT may also be deposited by sputter deposition or MOCVD, but a spin-on chemical solution decomposition process was used for demonstrating the process herein. The Pt films were sputtered onto either the Ti metal film or a highly {100}-textured titanium dioxide film grown by a thermal oxidation process of a sputtered Ti film. Oriented (001)-texture in the PZT was obtained by using a seed layer of PbTiO$_3$ (PT) that was deposited on top of the Pt electrode. When comparing the Ti/Pt and TiO$_2$/Pt bottom electrodes, the results indicate that the use of a highly oriented TiO$_2$ led to more highly (111)-textured Pt and improved PT and PZT orientations. PZT (52/48) and (45/55) thin films with and without PT seed layers were deposited and examined via x-ray diffraction methods (XRD) as a function of annealing temperature and the PbTiO$_3$ (PT) seed layer provided significant improvement in the (001) grain orientation while suppressing the (111) grain orientation of the PZT. Improvements in the Lotgering factor (f) were observed from existing Ti/Pt/PZT process (f=0.66), to samples using the PT seed layer as a template Ti/Pt/PT/PZT (f=0.87), and finally to films deposited onto the improved Pt electrodes TiO$_2$/Pt/PT/PZT (f=0.96). The highest Lotgering factor and corresponding improvements in the piezoelectric response were achieved with the stylo-epitaxial structure of TiO$_2$/Pt/PT/PZT. The stylo-epitaxy of this structure can be seen in the transmission electron micrographs (TEM), selected area electron diffraction (SAED) image, and fast-fourier-transform (FFT) images shown in FIGS. 10 to 15. Gowth of {111}-oriented Pt grains on {100}-oriented TiO$_2$ grains is observed in FIG. 10. The lattice image FIG. 11 shows the alignment of the TiO$_2$ and Pt grain boundaries indicating grain-on-grain growth. Correlated rotations of the fast-fourier-transform images in FIG. 12 confirm alignment of the TiO$_2$ and Pt crystal structures of the corresponding grains marked in FIG. 11. Similarly, grain-grain-alignments of {001}-oriented PbTiO$_3$ grains on {111}-oriented Pt and {001}-oriented PZT on {001}-PbTiO$_3$ is shown in the TEM images of FIGS. 13 and 15. Stylo-epitaxy of the TiO$_2$/Pt/PT/PZT structure, where the Pt layer has a {111}-texture, is confirmed by the combination of TEM, FFT, SAED and XRD results. By using a thermally oxidized {100}-textured seed layer, such as MgO, the Pt is grown with a {100}-texture that in-turn allows the growth of PZT and other perovskite structure thin films directly on the electrode with a {100}-texture and without the need for a PbTiO$_3$ seed layer. This allows some degree of independence of the PZT texture formation and the optimization of the PZT processing for composition and piezoelectric property control. Ideally, stylo-epitaxy of the MgO/Pt/PZT stack is achieved resulting in {001}-textured PZT.

Specifically stated, embodiments of this invention allow for the fabrication of {001}-textured PZT thin films without the use of a PbTiO$_3$-seed layer and it allows the integration of such a structure on Si wafers with generally accepted production processes. It will also allow the growth of other perovskite structure, {001}-textured, thin films including PbTiO$_3$, (PbLa)TiO$_3$, SrTiO$_3$, BaTiO$_3$, PbNiNbO$_3$, Pb(ZrTi)O$_3$, PbYbNbO$_3$, PbScTaO$_3$(Ba$_{1-x}$Sr$_x$)TiO$_3$, Pb(Mg$_{1/3}$Nb$_{2/3}$)O$_3$, Pb(ZnNb)O$_3$, PbYbNbO$_3$ and combinations thereof.

One embodiment of the present invention comprises crystallographically textured, thermally oxidized, metal thin films used as a template for seeded growth of crystallographically {100}-textured metal electrodes with the FCC crystal structure. The textured metal electrodes will in turn act as a seed layer for the growth of {001}-textured PZT, which is the desired crystallographic orientation for optimized piezoelectric and ferroelectric device performance. In particular, this embodiment focuses on the use of oxide seed layers exhibiting the rocksalt structure since {100}-textured thin films of this type will provide the best seeding template for growth of {100}-textured Pt, Ir, Au, Pd, Ru, Ag, Cu, Ni and other electrode metals compatible with PZT thin film growth.

Metal oxide single crystals exhibiting the rocksalt structure, e.g. MgO, CaO, and NiO, are known to provide good epitaxial substrates for the growth of (100) Pt thin films when the substrate crystal is cut to provide a (100) substrate plane. It has also been established that {100}-textured MgO films can provide a seed layer for {100}-textured Pt thin films. See, T. Matsumoto, K. Tamai, Y. Murashima, K. Komaki, S. Nakagawa, "Development of Pt/MgO(100) Buffer Layers for Orientation Control of Perovskite Oxide Thin Films," Jpn. J. Appl. Phys., 47, (9) pp. 7565-7569 (2008). In order to obtain a {100}-textured seed layer on Si and SiO$_2$/Si substrates, other researchers have used a seed layer, such as Fe, to initiate the textured growth of the MgO. In addition, reactive sputter deposition of MgO at high substrate temperatures, greater that 600° C., has been used to deposit the textured MgO films. The disadvantages of these methods for obtaining {100}- textured Pt electrodes include: 1) the requirement for an additional seed layer, such as Fe, that requires an extra source material and deposition step and 2) high in-situ deposition temperatures that often require specialized equipment that is not typically available in production deposition tools.

An aspect of this invention is that it uses a crystallographically textured metal thin film with a thickness in the range of 1 nm to 1 μm and more particularly in the range of 10 nm to 100 nm, which is converted to a crystallographically textured metal oxide by thermal oxidation. For example, a Mg metal film can be grown, and in fact naturally prefers to grow, with a {0001}-texture. When the {0001}-textured Mg film is annealed in an oxygen containing environment, the metal oxidizes and is converted to {100}-textured MgO with the rocksalt structure. With this processing method, the MgO/Mg system is self-seeding and relies on thermodynamically stable oxidation states and crystal habits when considering the growth conditions of the film. This processing method can be extended to any metal-oxide/metal seed layer system that can provide a good epitaxial match for the growth of Pt or related electrode materials. For example, the approach can be applied to MgO, CaO, SrO, NiO, FeO, ScO, VO, CrO, CoO, MnO, CuO, SrO, NbO, PdO, CdO, BaO, SmO, and RaO etc. The technique of forming seed layers from textured metal films could also be used to achieve electrode crystallographic textures other than the {100}-texture.

Drawing FIGS. 16-22

Figure 16:
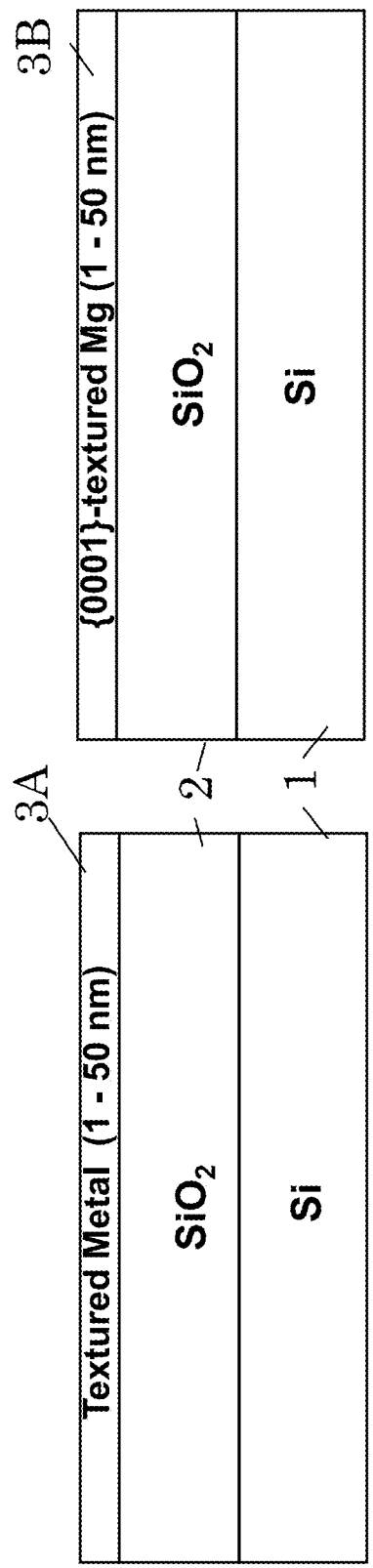
FIG. 16 illustrates a schematic diagram of textured metal deposition on a layer or layers such as $SiO_2$/Si. For example, magnesium may be deposited by DC magnetron sputtering in argon in a temperature range from room temperature (RT) to 600° C.

Referring now to the drawings, FIG. 16 illustrates a schematic diagram of textured metal deposition of a layer 3 on a layer or layers such as an $SiO_2$ layer 2 on an Si layer (or substrate) 1. As a further example, magnesium layer 3B may be deposited by a DC magnetron sputtering in argon on layers 1 and 2.

Figure 17:
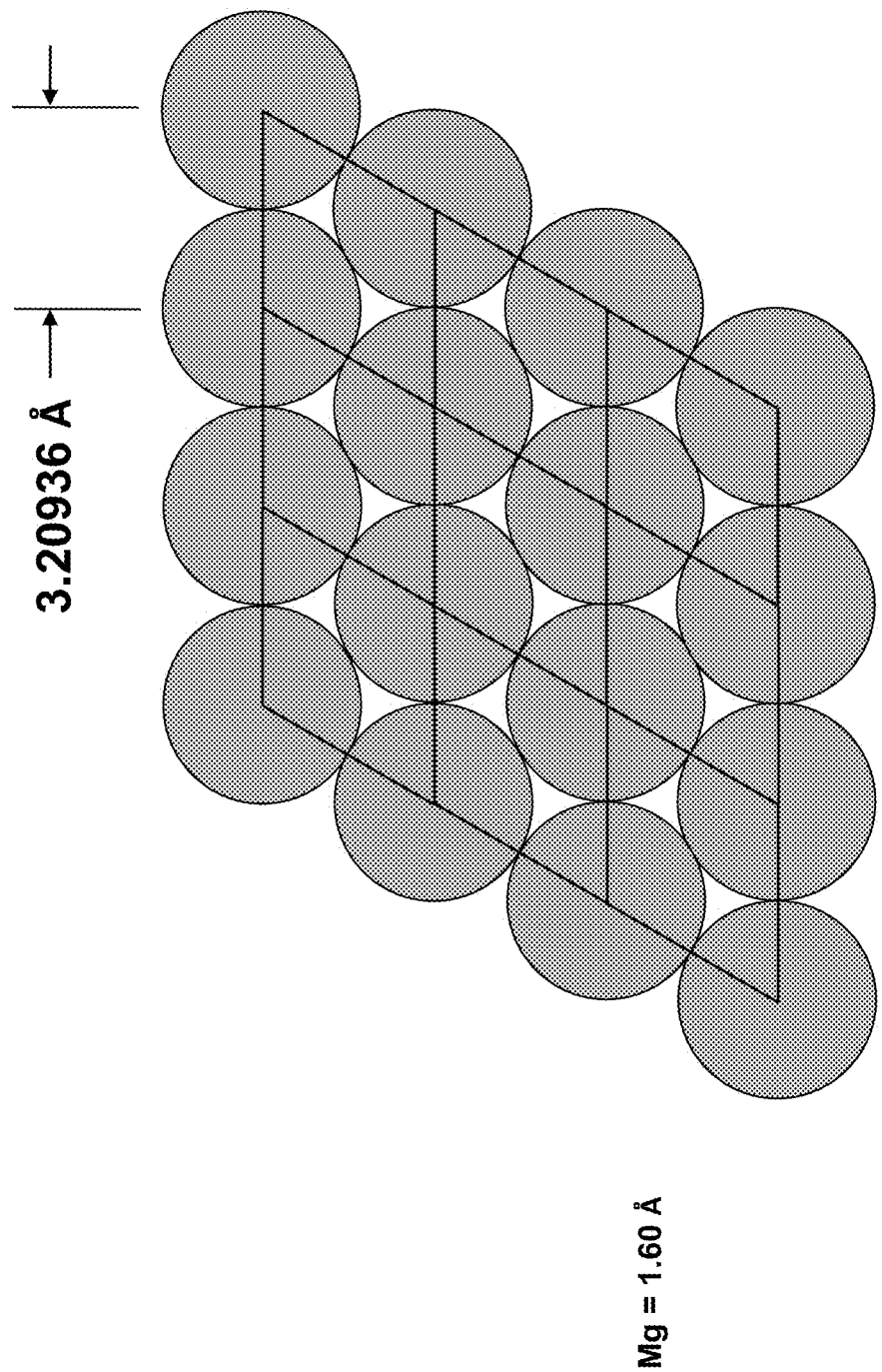
FIG. 17 is an illustration showing schematically the packing of Mg atoms in the (0001) basal plane of Mg metal atoms with the hexagonal close packed (HCP) crystal structure.

FIG. 17 illustrates the atomic level packing within the textured grains where the magnesium atoms in the (0001)-plane, as viewed along the [0001]-direction, lie parallel to the substrate planar surface.

Figure 18:
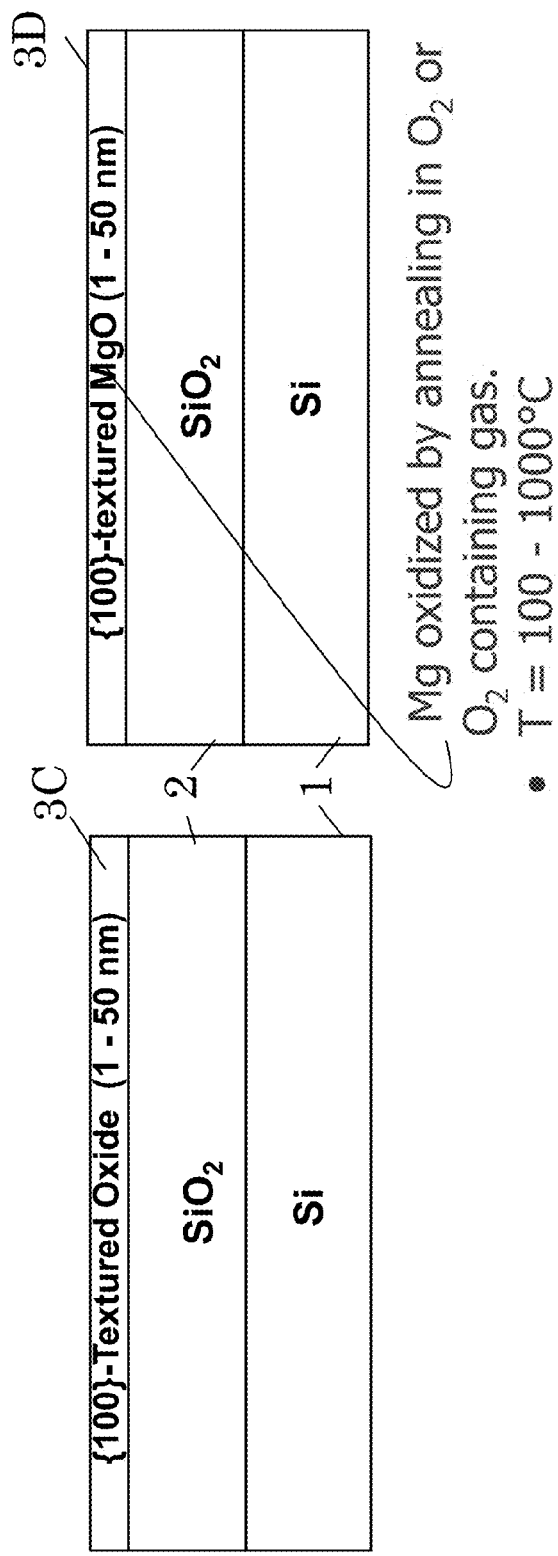
FIG. 18 illustrates a schematic diagram of thermal oxidation to form {100}-textured oxide (1-50 nm) with rocksalt structure. The magnesium may be oxidized by annealing in flowing $O_2$ or an oxygen containing environment. The temperature is a in the range from 100° C. to 650° C. and may be followed by subsequent anneals in the 500° C. to 1000° C. temperature range. Oxidation forms MgO having a rocksalt structure and {100}-texture.

FIG. 18 illustrates a schematic cross-section diagram of a {100}-textured oxide (1 nm to 1 μm thick, preferably 10 nm-100 nm thick) layer (layer 3C) formed by thermal oxidation of the textured metal layer 3A. The metal oxide layer, 3C, consists of the rocksalt crystal structure. As a further example of a textured oxide layer, the magnesium oxide layer 3D may be formed by annealing the magnesium layer 3B in flowing $O_2$. The anneal temperature may be in the range from 100° C. to 650° C. and the first anneal may be followed by a second anneal in the temperature range between 500° C. and 1000° C. Oxidation of magnesium forms MgO with the rocksalt structure and {100}-texture.

Figure 19:
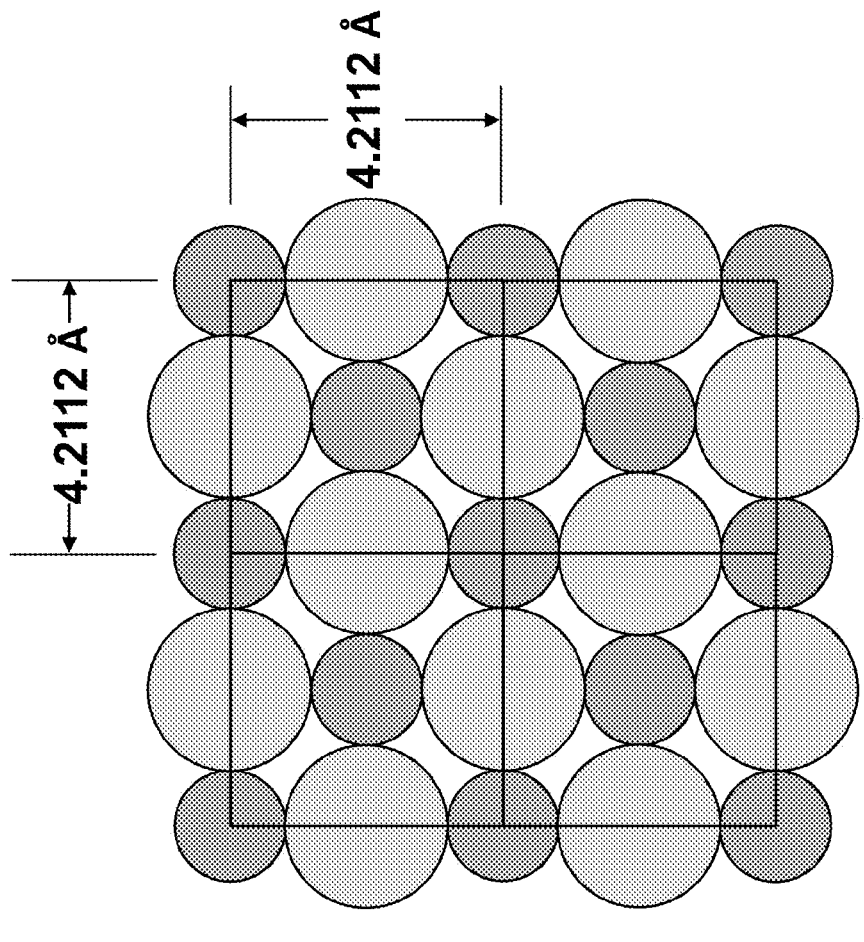
FIG. 19 is an atomic level illustration of the formation of the rocksalt structure, magnesium oxide (100)-plane as viewed along the [100]-direction. For a {100}-textured MgO film, the (100)-plane is parallel to the surface of the substrate.

FIG. 19 is an atomic level illustration of the rocksalt structure, magnesium oxide, (100)-plane as viewed along the [100]-direction.

Figure 20:
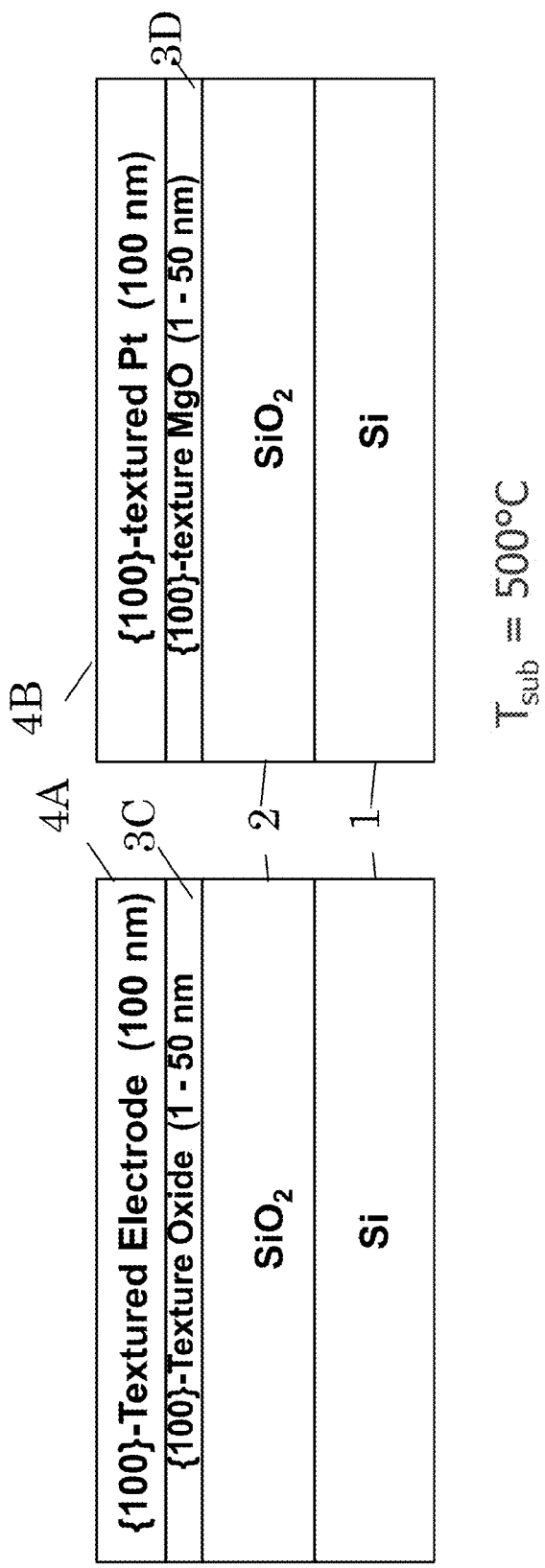
FIG. 20 illustrates a cross-section schematic diagram of {100}-textured platinum (Pt) (100 nm thick). The Pt is deposited by DC magnetron sputtering. The Pt has a face-centered cubic (FCC) structure with {100}-texture.

FIG. 20 illustrates a cross-section schematic diagram of a {100}-textured electrode metal layer 4A. As a further example of an electrode metal layer platinum (Pt) with a thickness of 1 nm to 500 nm, preferably 100 nm thick may be deposited (layer 4B). The Pt layer (4B) is deposited by DC magnetron sputtering. The Pt has a face-centered-cubic (FCC) structure with {100}-texture.

Figure 21:
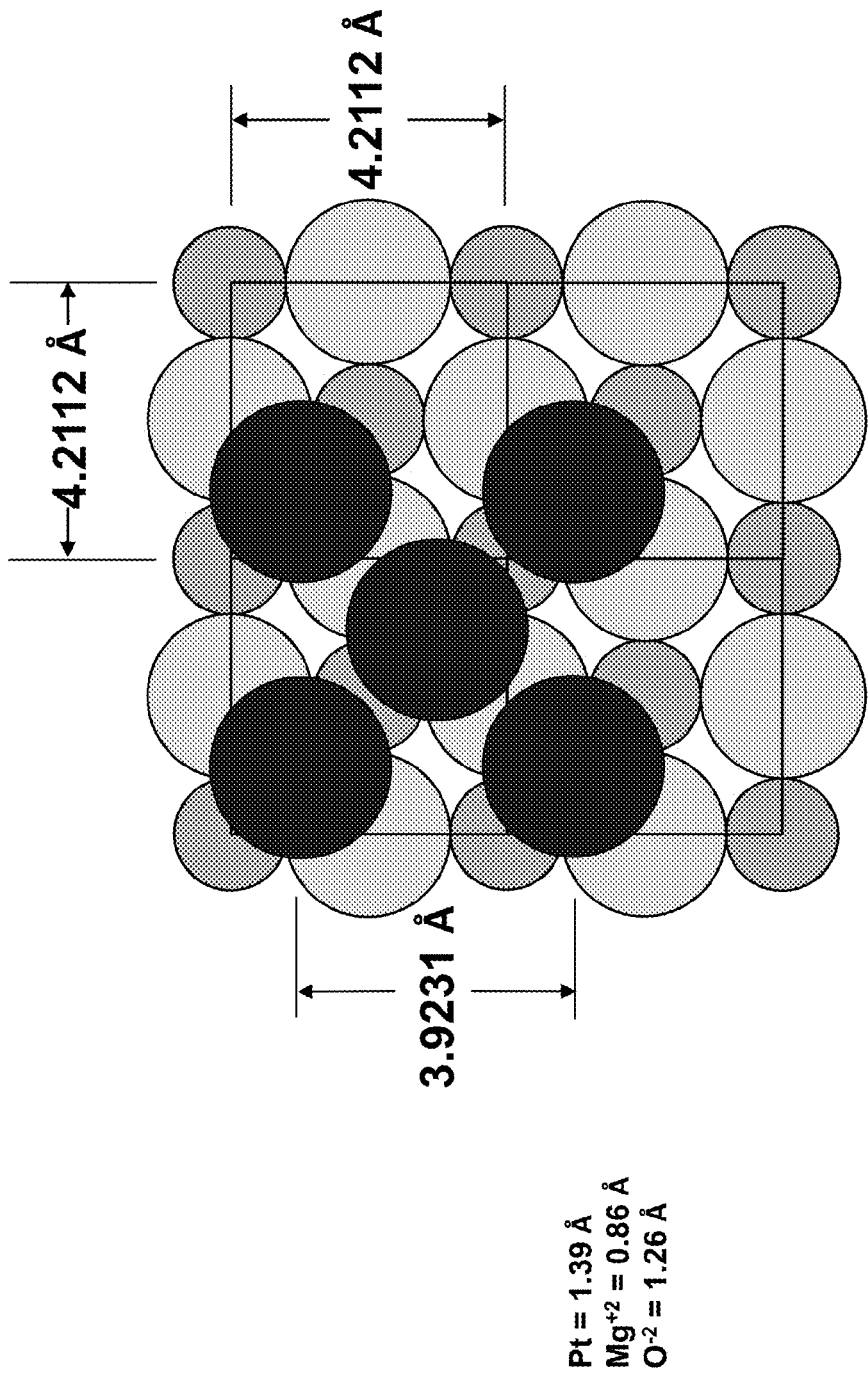
FIG. 21 illustrates, as an embodiment example, sputter-deposited platinum stylo-epitaxial layer and the registration of the Pt atoms in the (100) plane with the interstices of the MgO rocksalt (100)-plane as viewed along the [100]-direction. The (100)-Pt and (100)-MgO crystal structure registration occurs on a grain-by-grain basis.

FIG. 21 shows an atomic level illustration of how the atoms of a metal electrode in the (100)-plane and with the FCC crystal structure, in this case Pt, fit into the interstices of the (100)-plane of a rocksalt structure, metal oxide such as MgO. Both the Pt and MgO (100)-planes lie parallel to the surface of the substrate.

Figure 22:
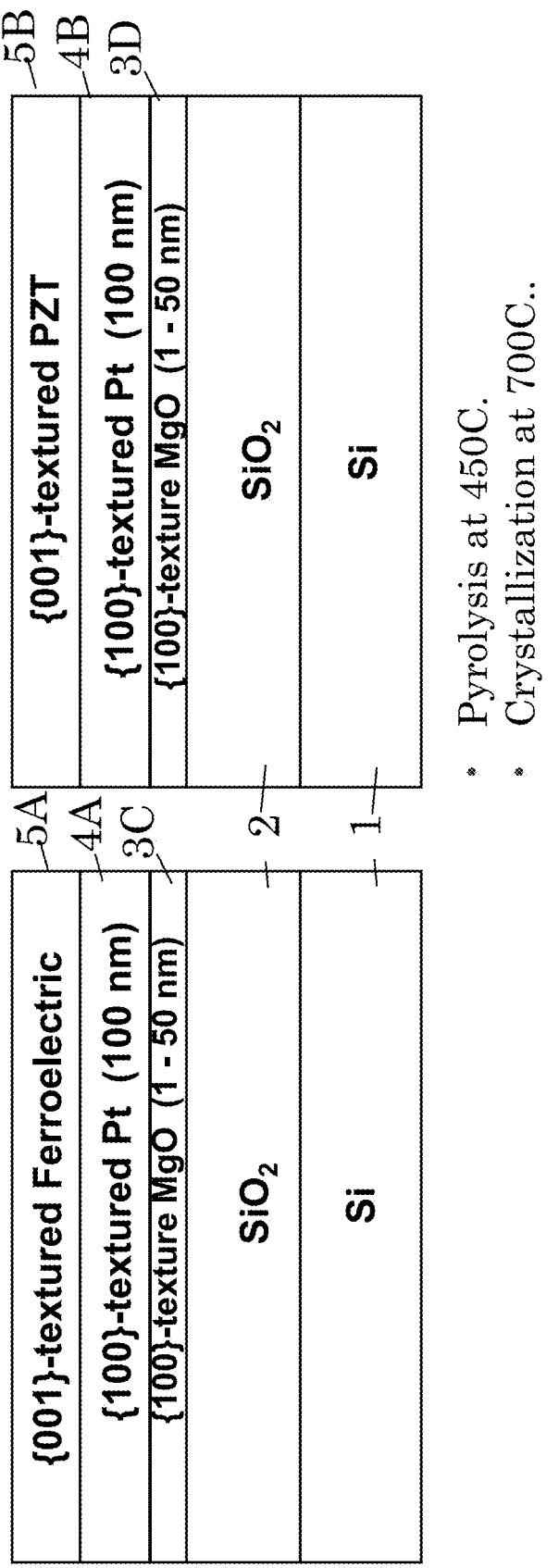
FIG. 22 illustrates a schematic diagram of the growth of {001}-textured ferroelectric {PZT}. The PZT ($PbZr_{0.52}Ti_{0.48}O_3$; 52/48) may be deposited by metalorganic solution spin-on process, sputtering or metalorganic chemical vapor deposition (MOCVD). The PZT has a perovskite structure with {001}-texture.

FIG. 22 illustrates a cross-section schematic diagram of the growth of a {001}-textured perovskite ferroelectric layer 5A.

As a further example of a {001}-textured ferroelectric layer PZT with a thickness of 10 nm to 10 μm may be deposited (layer 5B). The PZT ($PbZr_{0.52}Ti_{0.48}O_3$) is deposited by a metalorganic solution spin-on process but may also be deposited by sputtering or MOCVD. The PZT has a perovskite structure with {001}-texture.

Experimental Results

To ensure a sharp ferroelectric/electrode interface profile and prevent interdiffusion, the bottom electrode must exhibit a high density with a minimum of diffusion pathways (including pores and grain boundaries), and remain stable without degradation of the density and topography. If Pb depletion occurs at the ferroelectric/electrode interface, a low density electrode can allow Pb to diffuse completely through the Pt into the underlying $SiO_2$ layer. Pb reaction with $SiO_2$ causes both crystalline and amorphous lead silicate formation, compromising the electronic properties of the substrate and the PZT film.

Because crystallographic fiber texture is sensitive to composition, density, and surface roughness, texture is an extremely useful parameter for statistical process control of Pt and PZT. A powder diffractometer is utilized to obtain diffraction data for Ti, $TiO_2$, Pt, Mg, and MgO thin films on $SiO_2$ coated Si substrates. Quantitative analysis of the diffraction data was used to determine the $TiO_2$ and Pt deposition conditions resulting in the highest level of Pt {111}-texture, which typically corresponds to optimal density and a minimized Pt and Pb diffusion during subsequent PZT processing. The objective of the Pt texture optimization study was to improve orientation, density and the interdependent electrical properties of the subsequently deposited PZT.

Experimental Details

Four inch diameter silicon substrates were obtained with 500 nm±5% (plus or minus five percent) thermal oxide from both Addison and Silicon Quest International. Titanium films were sputter deposited on the as-received $SiO_2$ at a substrate temperature of 40° C. using a Unaxis Clusterline 200 chamber configured with a DC rotating-magnet magnetron and a 250 mm diameter, 99.99% pure Ti target. The deposited Ti thin films were converted to $TiO_2$ with an oxygen anneal in a Bruce Technologies International™ 6 in. diameter quartz tube furnace. The furnace was heated, with 5 SLM flowing $N_2$, to the setpoint (650° C.-800° C.). Then the wafer carrier (boat) was loaded and pushed into the tube hot zone over a period of 10 min. At the start of the wafer push step, the $N_2$ flow was turned off and the $O_2$ gas flow was ramped up to 10 SLM. After the wafer push, the wafers were held in the hot zone for either 15 or 30 min. The boat was then pulled from the hot zone over a period of 10 min. When the wafers were fully retracted the $O_2$ flow was turned off, and the $N_2$ flow was resumed at 5 SLM. The wafers were removed from the boat loader after allowing them to cool for at least 10 min. After the oxidation anneal, Pt was sputter deposited onto the $TiO_2$ using a second Unaxis Clusterline 200 chamber configured with a DC rotating magnet magnetron and a 99.99% pure, 250 mm diameter Pt target. All Pt depositions were completed with the same conditions of 0.5 kW, 50 sccm Ar, 30.5 s and a substrate setpoint temperature of 500° C. The resulting Pt films were nominally 100 nm in thickness. To condition the chamber and target, test wafers were deposited prior to sample wafer depositions, thereby ensuring stability of the deposition conditions. Characterization of the as-deposited metal films included multi-site, 4-point probe measurements of the sheet resistance and single-site X-ray diffraction (XRD) measurements, while characterization of the annealed $TiO_2$ films included multi-site ellipsometry measurements of thickness and refractive index and single-site XRD measurements. The sheet resistances, $R_s$, of Ti and Pt films were measured on a Prometrics Versaprobe VP10 and a Four Dimensions, Model 280, Automatic Four-Point Probe Meter, respectively. A J. A. Woollam ellipsometer, model M-2000F, was used for measuring the thickness, and refractive index of the as-received $SiO_2$ coatings and the annealed $TiO_2$ films, using a trial thickness of 500 nm (30 nm) for $SiO_2$ ($TiO_2$), Si and $SiO_2$ reference data, and $TiO_2$ Cauchy layer fitting parameters $A_n$~2.5 and $B_n$~0.05. A Rigaku Ultima III powder diffractometer with Bragg-Brentano optics, Cu X-ray source, graphite monochromator on the detector arm, and scintillation detector was used to make θ-2θ and rocking-curve measurements on the thin film PZT, Pt, $TiO_2$ and Ti coated wafers. General θ-2θ measurements were collected using a continuous scan of 2°/min and data collection step size of 0.01° over a range of 10°-90°. Using a continuous scan rate of 1°/min and step size of 0.02°, local Ti 200 and 400 and Pt 111 and 222 scans were measured to quantify the position of the maximum θ-2θ peak intensities, immediately followed by a rocking curve scan at a continuous rate of 5-20 sec/count and a step size of 0.02°-0.2° for Ti (1.0°/min and step size of 0.01° for Pt) at the fixed Bragg angle. A single peak Pearson VII algorithm was used to fit the measured diffraction peaks and obtain quantitative values of the rocking-curve at full width half maximum (RC-FWHM). Because the higher-angle Pt 222 peak provided a lower intensity than the Pt 111 peak, it was used to assure that all quantitative measurements were collected in the linear response range of the diffractometer detector.

Drawing FIGS. 2-25

Figure 2:
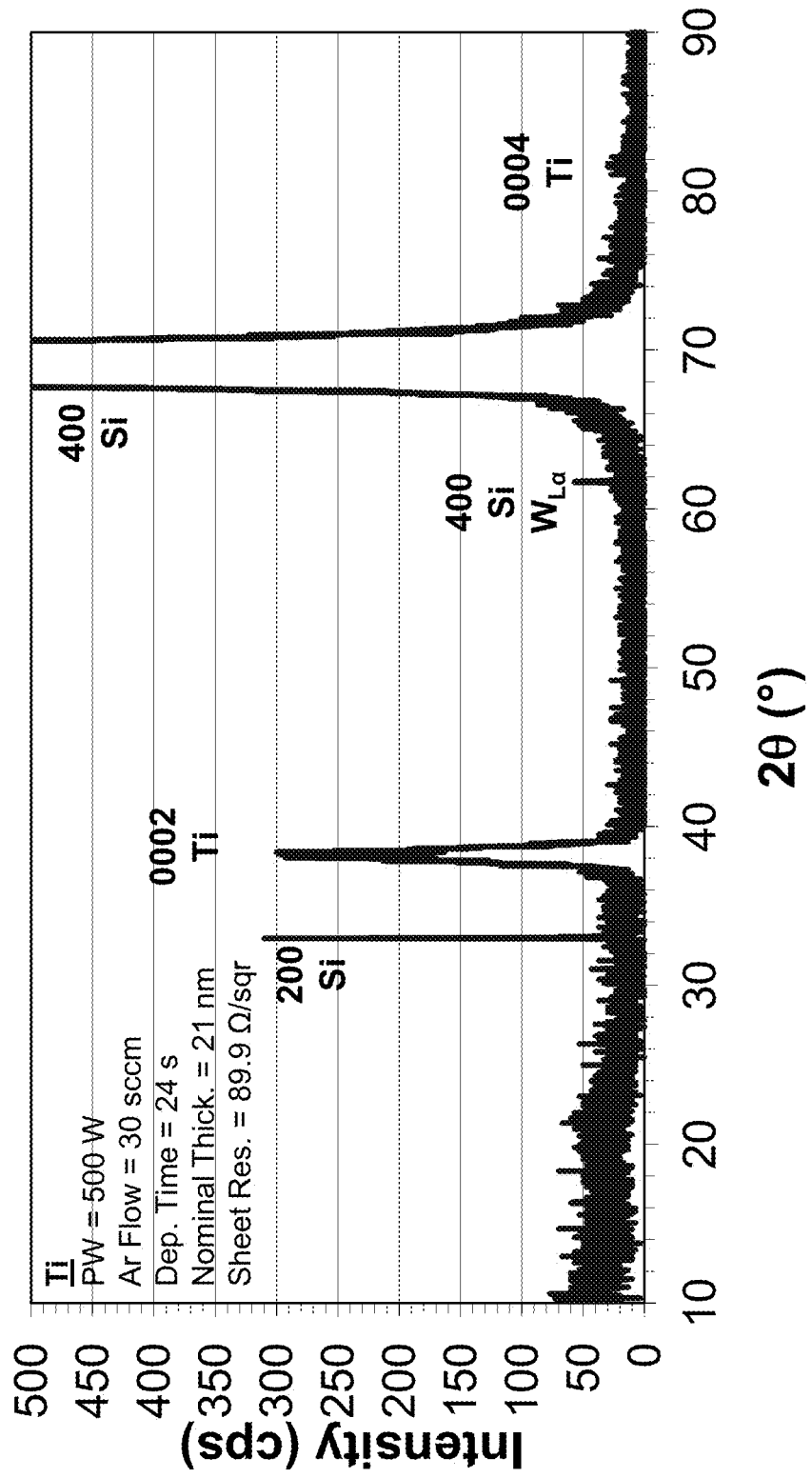
FIG. 2 graphically illustrates an x-ray diffraction (XRD) θ-2θ scan of an as-deposited Ti film exhibiting only 0001 diffraction peaks and thus confirming the HCP structured Ti {0001}-texture.
Figure 3:
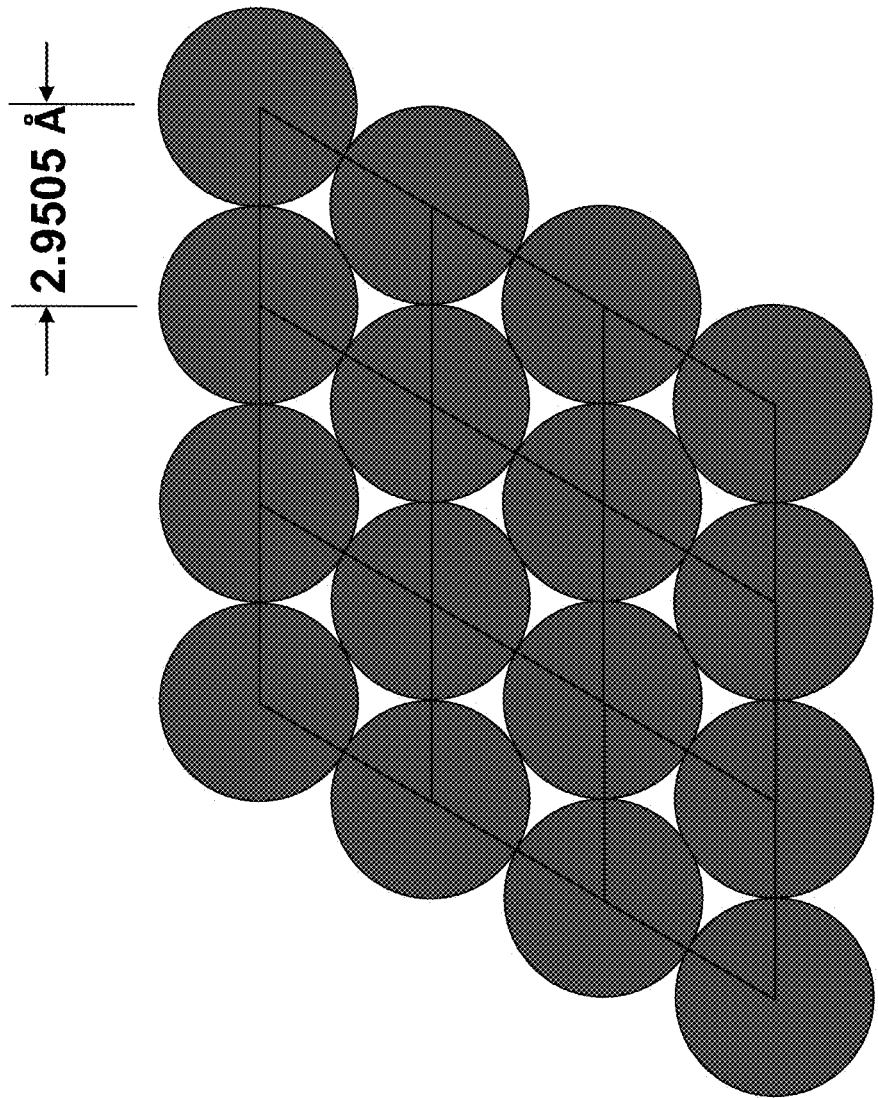
FIG. 3 is an illustration showing schematically the packing of Ti atoms in the (0001) basal plane of Ti metal with the hexagonal-close-packed crystal structure.
Figure 4:
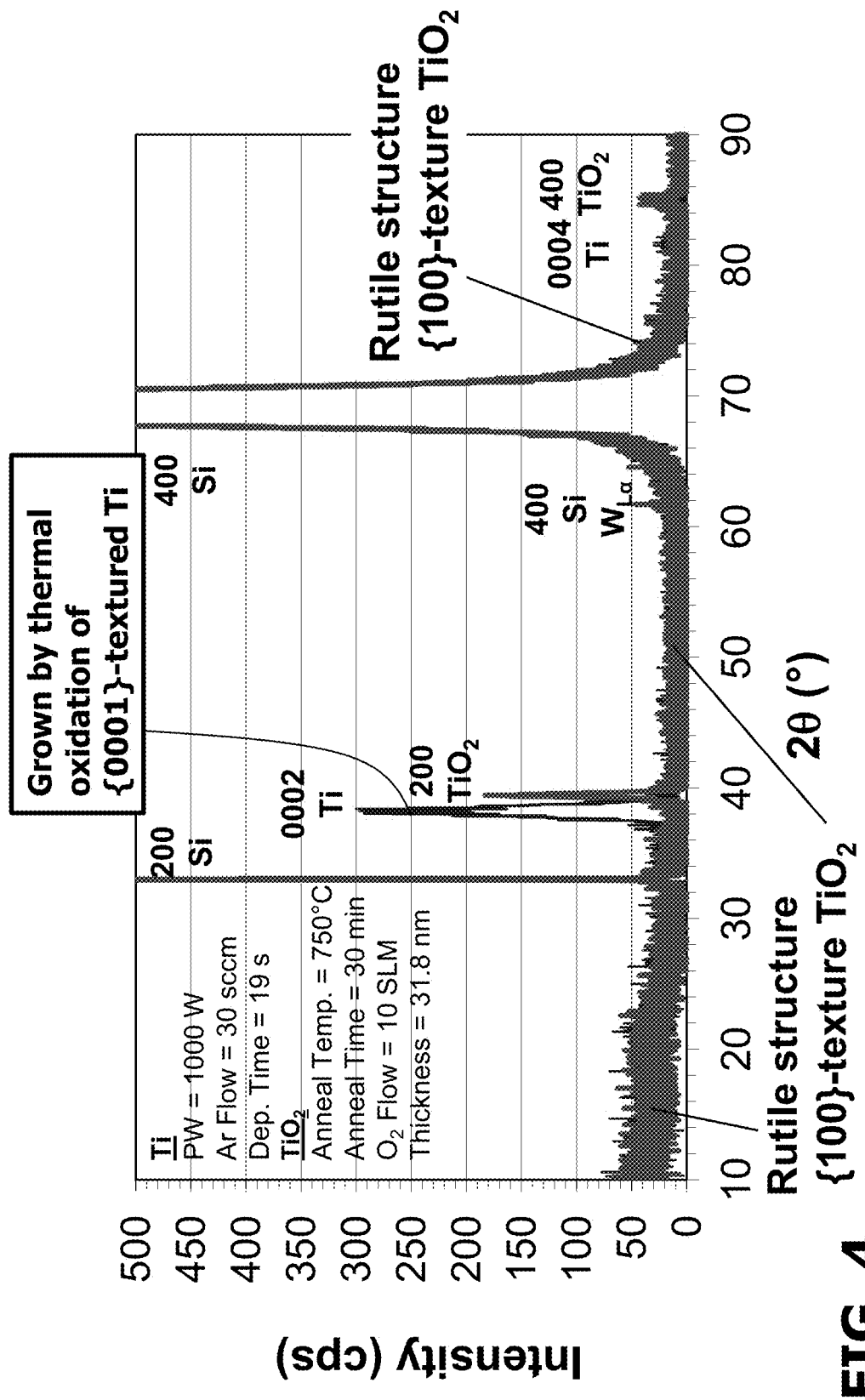
FIG. 4 graphically illustrates an XRD θ-2θ scan of a $TiO_2$ film confirming {100}-textured rutile structure and comparison with an as-deposited {0001}-textured Ti film.

A basic analysis of the crystallography of Ti, $TiO_2$, Pt and PZT films was completed by collecting a θ-2θ scan of samples from each deposition condition. Representative spectra are shown in FIGS. 2, 4, 5 and 7. FIG. 2 shows a θ-2θ XRD spectrum for a Ti thin film deposited at 0.5 kW, 30 sccm Ar, 24 s, and 40° C. The as-deposited Ti film had a nominal thickness of 21 nm and a measured sheet resistance of 89.9 Ohm/sq. Since only two Ti 0001 reflections, the 0002 and 0004 peaks of the hexagonal-close-packed (HCP) structure (ICDD card #44-1294), are observed in addition to the substrate generated peaks described above, it can be concluded that the Ti film is strongly {0001}-textured with the basal plane of the HCP structure lying in the plane of the substrate. This conclusion was also confirmed by measuring the 0002 rocking-curves of the Ti films and observing RC-FWHM (rocking-curve full width at half maximum intensity) that were consistent with {0001}-texture but varied with deposition conditions. An illustration of the ideal atomic level HCP (0001) basal-plane of the Ti as viewed along the [0001]-direction is given in FIG. 3. Broadening of the RC-FWHM results from increased tilting of Ti grains such that the (0001)-plane is not perfectly parallel with the planar substrate surface. The study presented here focused on finding a combination of Ti deposition and oxidation anneal conditions that resulted in a baseline {100}-textured $TiO_2$ template for {111}-textured Pt growth and enhanced electrode temperature stability. Based on the collected data it was determined that the {0001}-texture distribution of the Ti film determines the ultimate $TiO_2$ {100}-texture distribution that can be achieved via oxidation annealing, but the data presented below indicates that Ti texture is only one factor contributing to the final $TiO_2$ texture quality. An example of a diffraction pattern for a $TiO_2$ film formed by thermal oxidation of the Ti film (annealed at 750° C. for 30 min) is shown in FIG. 4. The $TiO_2$ film had a measured thickness of 32 nm and refractive index of 2.65. The diffraction pattern exhibits only rutile 200 and 400 peaks, indicative of a {100}-textured $TiO_2$ film. Variation in anneal temperature (650-800° C.) and anneal time (15-30 min) strongly affected the 200 and 400 $TiO_2$ diffraction peak positions, intensities, and widths but did not cause the appearance of any new diffraction peaks. The quantified parameters of the 200 and 400 $TiO_2$ peaks reached a plateau at 750-800° C. for 30 min anneal times, suggesting completion of the Ti-to-$TiO_2$ conversion under these conditions.

Figure 8:
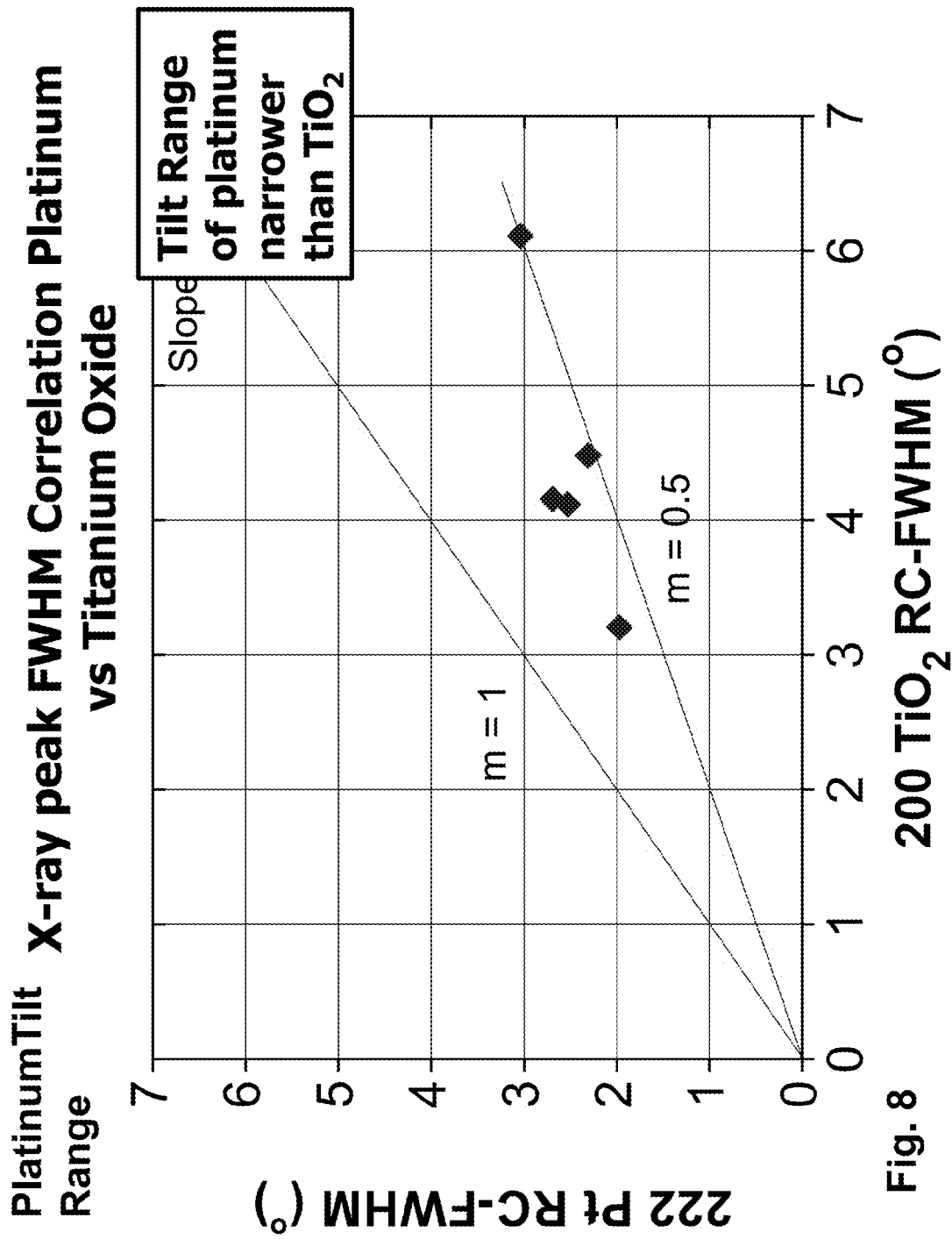
FIG. 8 is a plot showing the correlation between Pt 222 and $TiO_2$ 100 tilt distribution widths (diamonds), determined from XRD rocking-curve FWHM measurements, and trend reference lines.
Figure 9:
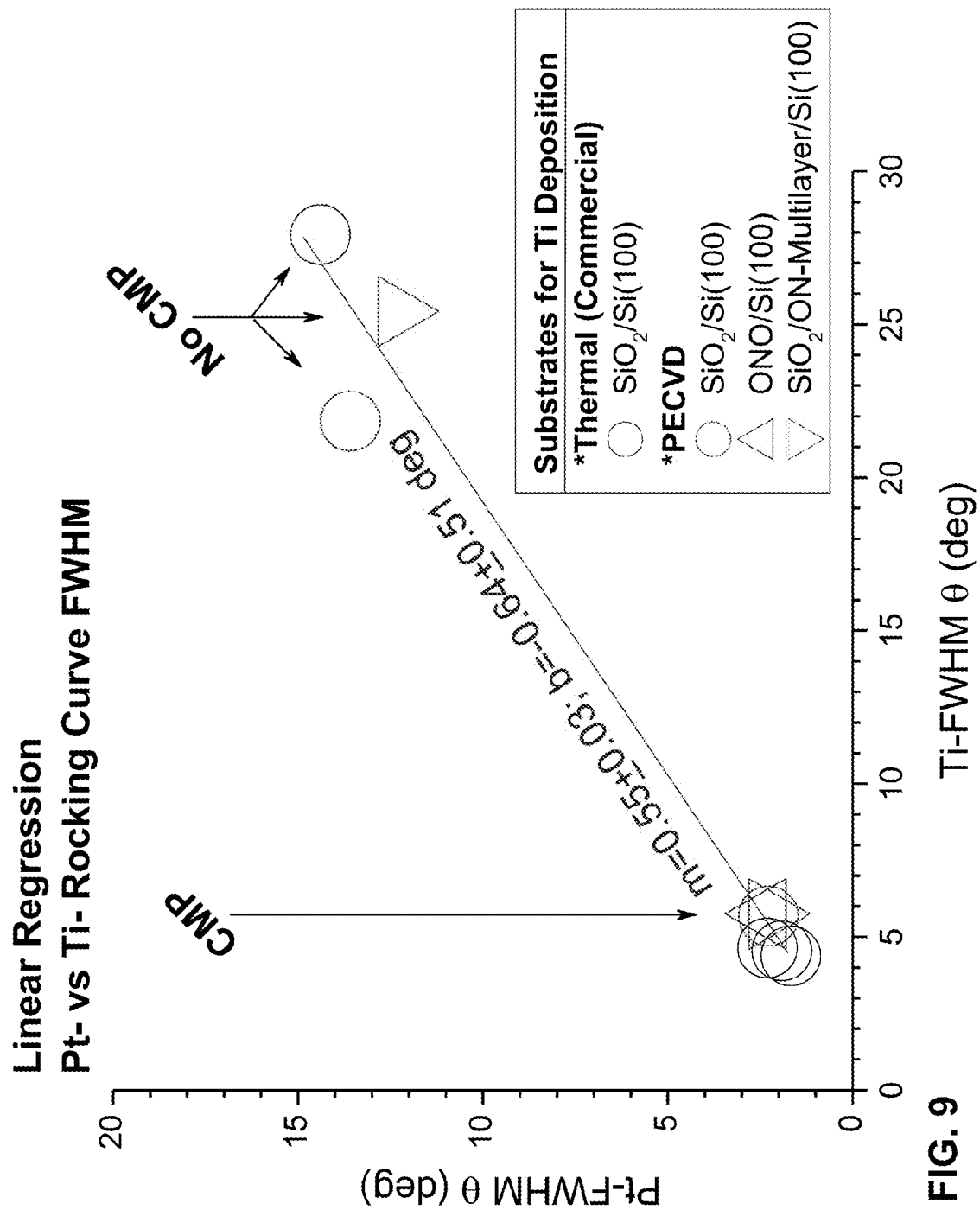
FIG. 9 is a plot showing the correlation between Pt 222 and Ti 0001 tilt distribution widths (data point symbols), determined from XRD rocking-curve FWHM measurements, and trend reference lines

From these observations along with the measurements summarized in FIG. 8 and FIG. 9, it can be concluded that the original Ti {0001}-texture is maintained during the oxidation process and that the oxygen merely stuffs the Ti lattice to form the rutile structure in the $TiO_2$ film with {100}-texture. Such an oxidation mechanism is consistent with the (0001)Ti// (010)$TiO_2$ epitaxial relationship reported for rutile scale formed on bulk Ti metal. An as-deposited Ti spectrum superimposed on the $TiO_2$ spectrum shows consistency in how the XRD data is collected for quantitative analysis.

Figure 5:
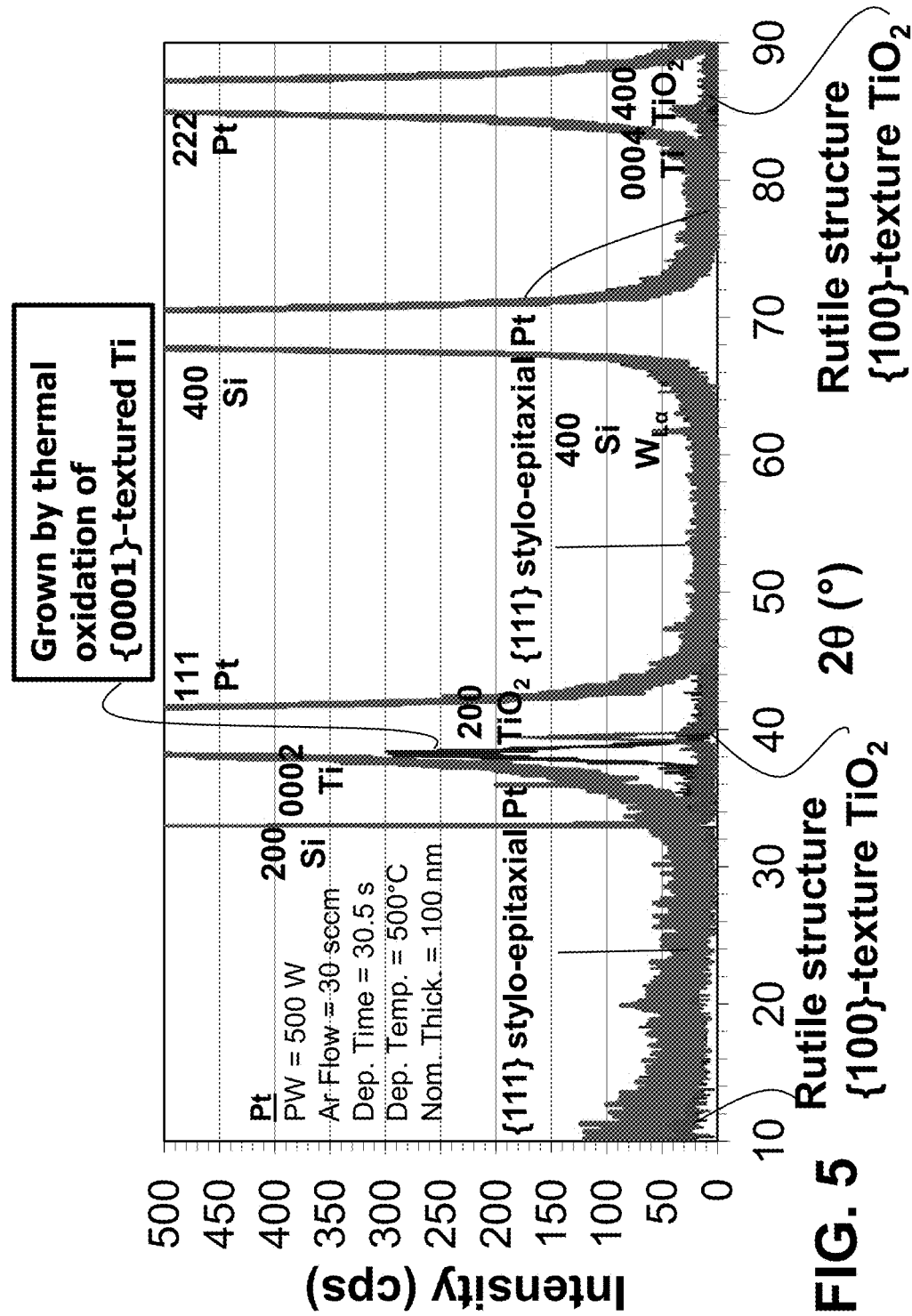
FIG. 5 is a comparison of XRD θ-2θ spectra for {111}-textured Pt, {100}-textured $TiO_2$ seed layer, and an as-deposited {0001}-textured Ti film.
Figure 6:
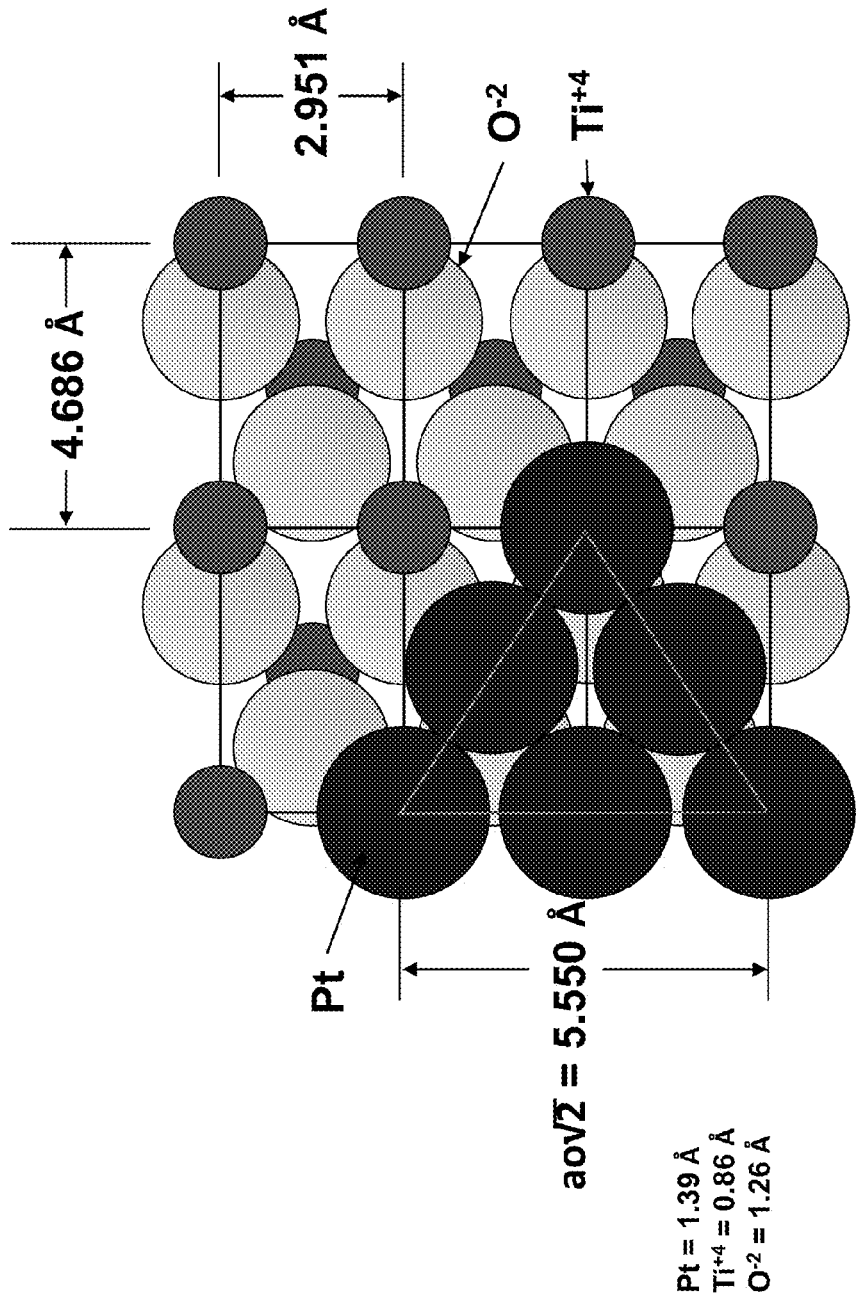
FIG. 6 illustrates, sputter-deposited platinum stylo-epitaxial layer and the registration of the Pt atoms in the (111) plane with the interstices of the $TiO_2$ rutile oxygen plane as viewed along the [100]-direction. The (111)-Pt and (100)-$TiO_2$ crystal structure registration occurs on a grain-by-grain basis.

An evaluation of the Pt electrode film sheet resistance did not show any obvious differences related to variations of the $TiO_2$ seed layer. The sheet resistivity of the Pt was 1.25 Ohms/sq±0.2 Ohms/sq standard deviation. The constancy of the Pt sheet resistance can be expected since all wafers were coated under fixed Pt deposition conditions and because the Pt exhibits isotropic conductivity that is independent of crystallographic texture. Despite the constancy of the Pt sheet resistance, the Pt texture is found to vary significantly and in accordance with the underlying $TiO_2$ seed layer and its parent Ti layer from which the thermal oxidized $TiO_2$ was grown. An example XRD spectrum of a highly {111}-textured Pt film is shown in FIG. 5, which also shows the superposed spectra for {0001}-textured Ti and {100}-textured $TiO_2$ seed layers. The expanded y-scale allows one to clearly inspect the background intensity and observe that only the 111 and 222 peaks (the tops of these Gaussian shaped peaks are cut off) occur in the Pt spectrum. In addition to the θ-2θ XRD observations, measurements on the 111 and 222 Pt peak rocking-curves support the conclusion that the Pt film is {111}-textured. Over the range of $TiO_2$ seed layer thicknesses and processing conditions investigated, the Pt 111 and 222 RC-FWHM varied between 1° and 8°. In order to prove that the {100}-textured $TiO_2$ is acting as a seed layer for growth of {111}-textured Pt, a correlation between the textures of the two layers must be established. Such a correlation is shown in FIG. 8, where it can be seen that the Pt 222 RC-FWHM increases linearly with increasing $TiO_2$ 200 RC-FWHM. Additionally, it was observed that for constant thickness $TiO_2$ and Pt films, an increase in the intensity of the h00 $TiO_2$ diffraction peaks directly corresponds to an increased intensity for the hhh Pt diffraction peaks, which is consistent with grain-to-grain heteroepitaxial behavior. An illustration of the heteroepitaxial relationship between the Pt (111)-plane and the oxygen-terminated (100)-plane of rutile structure $TiO_2$ is shown in FIG. 6. Direct observations of the Pt and $TiO_2$ grain-by-grain alignment are shown in FIGS. 10 and 11 and stylo-epitaxy is supported by the corresponding rotations of the FFT (FIG. 12) from the contacting Pt and $TiO_2$ grains.

Proof that that the as-deposited Ti {0001}-texture determines and effectively seeds the thermally oxidized $TiO_2$ {100}-texture is also provided by the linear relationship between the Pt 222 RC-FWHM and the Ti 0001 RC-FWHM shown in FIG. 9. The linear correlation between the Pt 222 RC-FWHM and the Ti 0001 RC-FWHM has the same slope of 0.5 as observed for the correlation between Pt and $TiO_2$ shown in FIG. 8. The observation that the $TiO_2$ texture is maintained and directly correlated to the Ti texture distribution is an extremely important point because it indicates that the sequence of process steps and resulting textures could be applied to other metal/metal-oxide thin film systems. It also indicates that other metal/metal-oxide systems could be used for seeding textured growth of Pt electrodes via a heteroepitaxial relationship.

Figure 7:
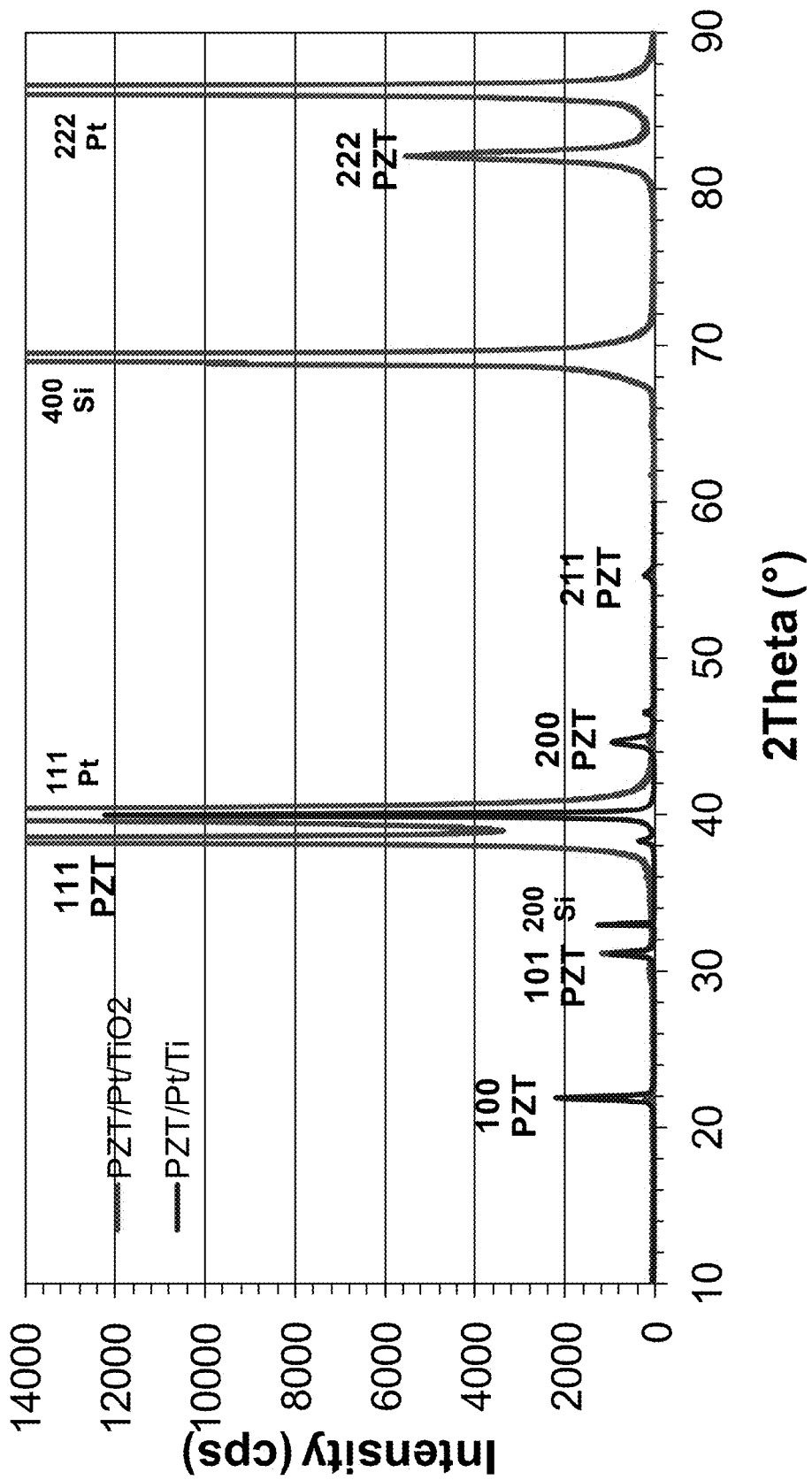
FIG. 7 is a graphical comparison of XRD θ-2θ spectrum for {111}-textured $Pb(Zr_{0.45}Ti_{0.55})O_3$ prepared with 8% excess Pb deposited on $Pt/TiO_2/SiO_2/Si$ and $Pt/Ti/SiO_2/Si$.

Finally, it was determined that the highly {111}-textured Pt grown on the {100}-textured $TiO_2$ seed layer resulted in improved {111}-textured PZT due to templating from the improved {111}-textured Pt electrode. Templating was confirmed by comparing the RC-FWHM of the Pt and PZT films. The improved {111}-texture of the PZT was confirmed by comparing the PZT film Lotgering factors of 0.97 and 0.66 for optimized and non-optimized {111}-textured Pt electrodes, respectively. FIG. 7 shows the XRD spectrum for a PZT film with Zr/Ti=0.45/0.55 on the {111}-textured $TiO_2$/Pt electrode superposed onto the spectra of just the Pt and $TiO_2$.

Ti thin films in the range of 10-50 nm thickness can be deposited with a {0001}-textured HCP structure and converted to a {100}-textured $TiO_2$ with the rutile structure by using a thermal oxidation process. The {100}-textured $TiO_2$ can be used as a seed layer to grow a {111}-textured Pt via localized heteroepitaxy. Correlation of the 100 $TiO_2$ and 222 Pt rocking-curve FWHM was used to determine the heteroepitaxy seeding effect. The Pt electrode process change that results in improved {111}-textured Pt has resulted in the {111}-textured PZT growth. The work of L. M. Sanchez, D. M. Potrepka, G. R. Fox, I. Takeuchi, and R. G. Polcawich, entitled "Improving PZT Thin Film Texture Through Pt Metallization and Seed Layers," Mat. Res. Symp. Proc., Fall 2010 (Mat. Res. Soc., Warrendale Pa.) Manuscript S4.9, hereby incorporated by reference, builds further on this result to show that it has also enabled significant improvements in {100}-textured PZT growth when using a lead titanate seed layer on a Pt electrode surface.

Figure 23:
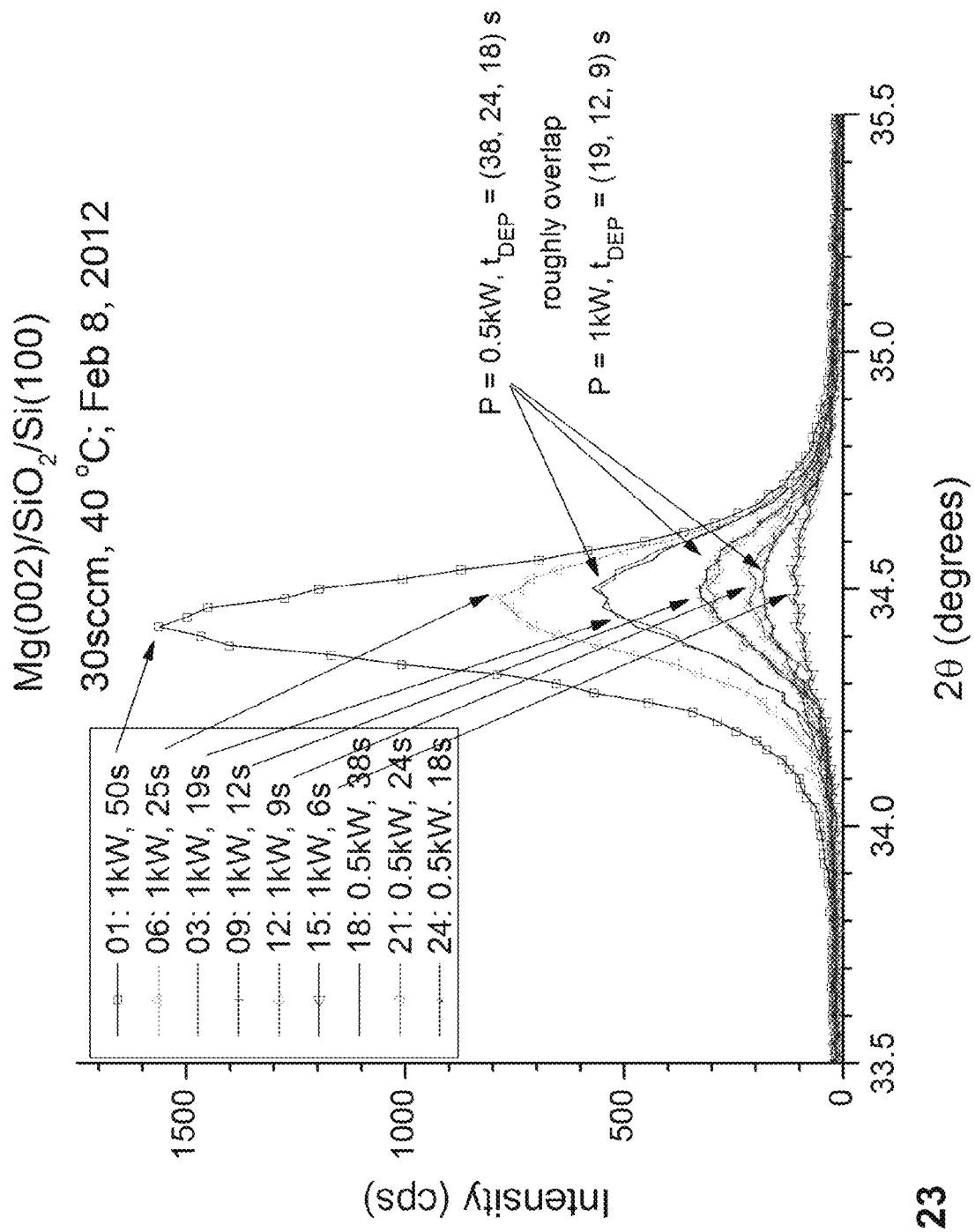
FIG. 23 graphically illustrates overlapping x-ray diffraction (XRD) θ-2θ scans of as-deposited Mg films (deposited under various sputtering conditions) exhibiting only 0001 diffraction peaks and thus confirming the HCP structured Mg {0001}-texture.
Figure 24:
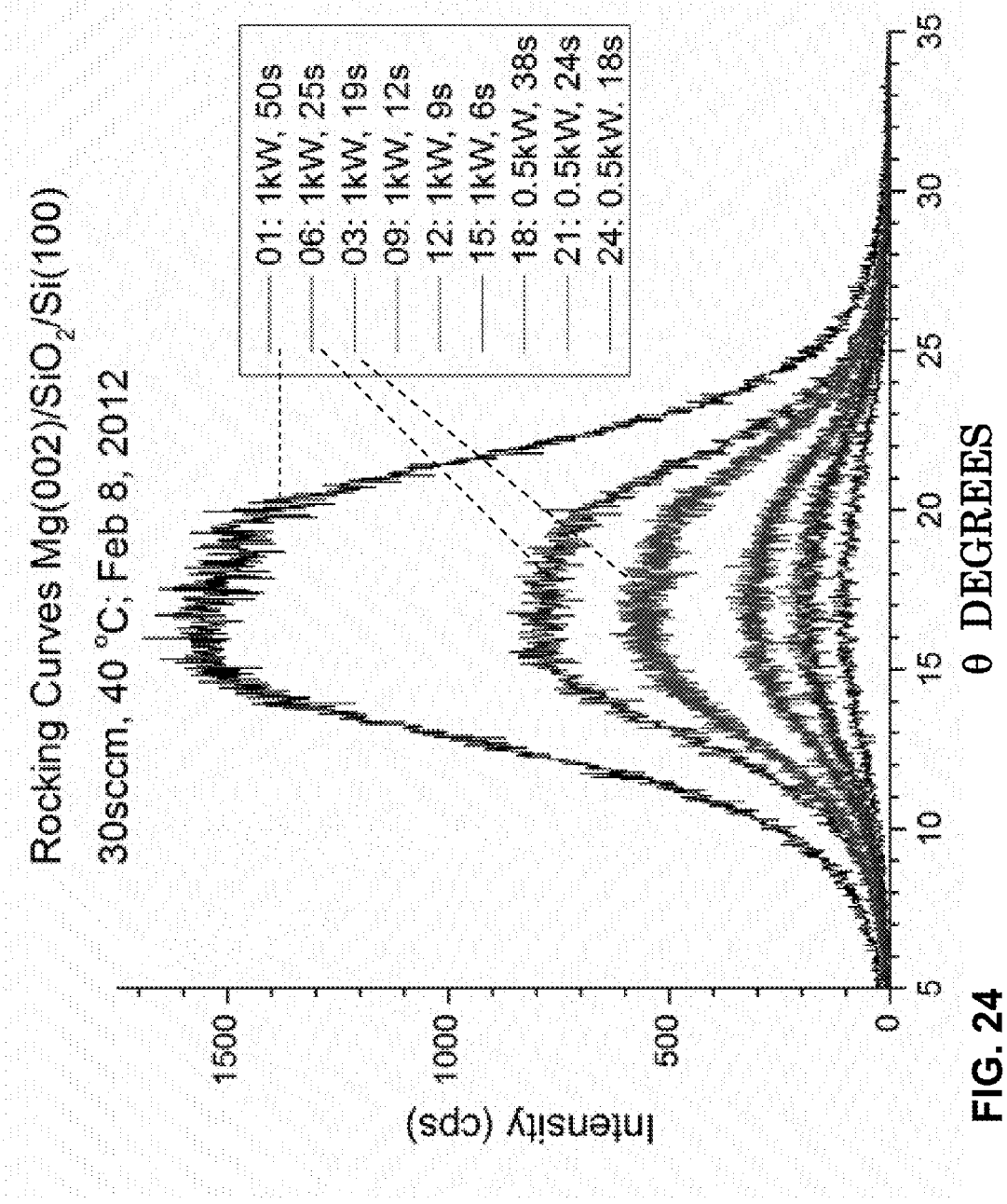
FIG. 24 graphically illustrates overlapping x-ray diffraction (XRD) rocking curves of as-deposited Mg films of various thicknesses exhibiting only {0001}texture with a tilt distribution width (full width at half maximum intensity) of less than 15°.

A similar sequence of processing steps and analysis to that described above for the Ti/$TiO_2$ material system was extended to the Mg/MgO system. Like Ti, Mg exhibits the HCP crystal structure and it can be deposited with a {0001}-texture by vapor deposition. The {0001}-texture of Mg films deposited by DC magnetron sputtering under a variety of conditions was confirmed by XRD diffraction. FIG. 23 graphically illustrates overlapping XRD θ-2θ scans of as-deposited Mg films exhibiting only 0001 diffraction peaks and thus confirming the HCP structure Mg {0001}-texture. FIG. 24 graphically illustrates overlapping XRD rocking curves of the as-deposited Mg films of various thicknesses exhibiting only {0001}-texture with a tilt distribution width, RC-FWHM, of less than 15°. An illustration of the ideal atomic level HCP (0001) basal-plane of the Mg as viewed along the [0001]-direction is given in FIG. 17. Broadening of the RC-FWHM results from increased tilting of Mg grains such that the (0001)-plane is not perfectly parallel with the planar substrate surface.

Figure 25:
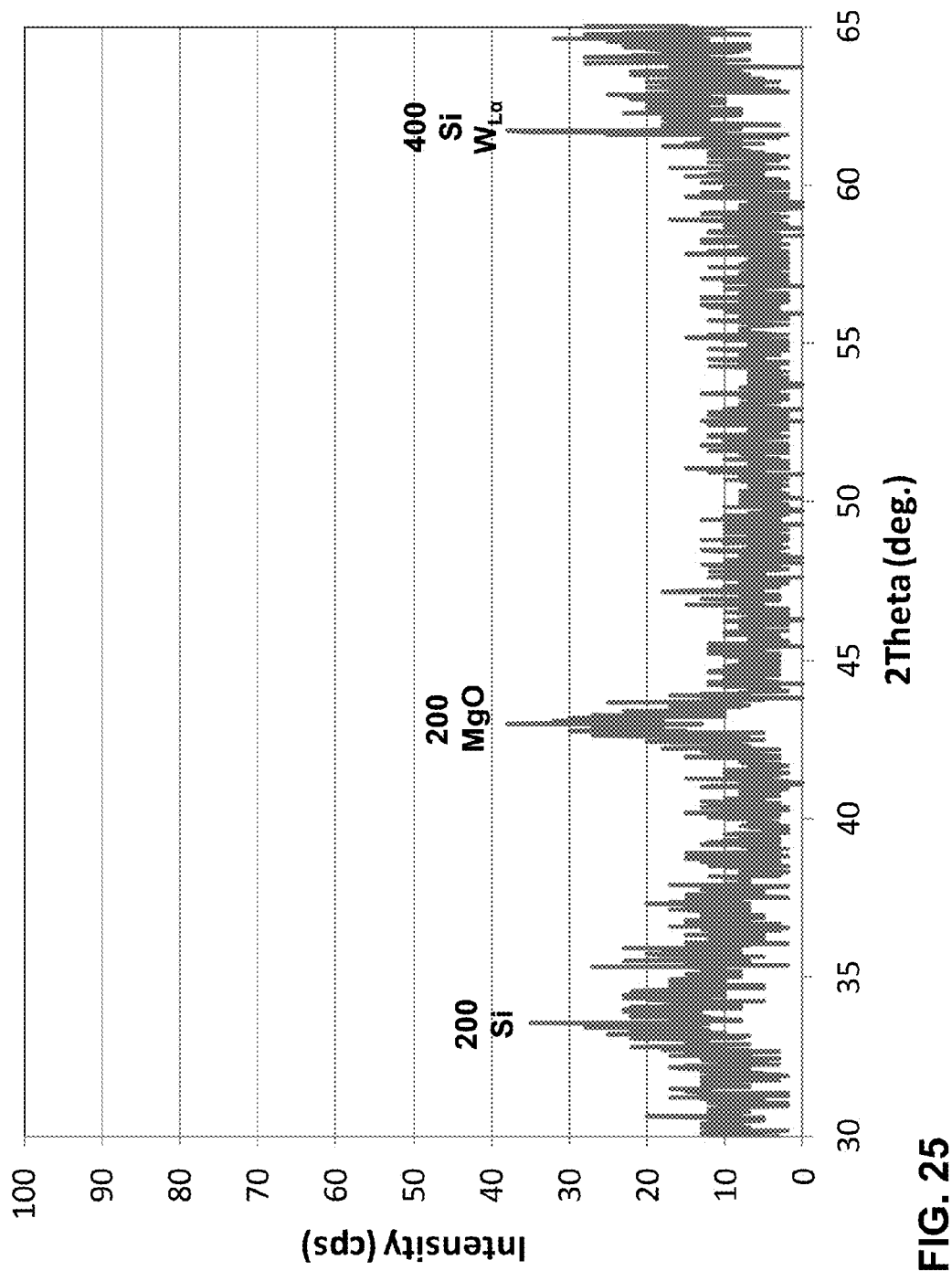
FIG. 25 graphically illustrates an x-ray diffraction (XRD) θ-2θ scan of an MgO film, formed by thermal oxidation of an Mg film heated in flowing oxygen at 625° C. for 30 min, exhibiting only 0001 diffraction peaks and thus confirming the rocksalt structure and MgO {100}-texture.

Unlike Ti, which is thermally oxidized to produce the rutile structure, Mg is thermally oxidized and it produces MgO with the rocksalt crystal structure. FIG. 25 graphically illustrates an x-ray diffraction (XRD) θ-2θ scan of an MgO film, formed by thermal oxidation of an Mg film heated in flowing oxygen at 625° C. for 30 min, The XRD of the MgO confirms the formation of the rocksalt structure and MgO {100}-texture.

From the observations on the Mg/MgO system it can be concluded that metals such as Mg, Ca, Sr, Ni, Fe, Sc, V, Cr, Co, Mn, Cu, Sr, Nb, Pd, Cd, Ba, Sm, Ra and other metals exhibiting the HCP crystal structure can be sputter deposited to produce {0001}-texture films. The {0001}-textured metal films can then be thermally oxidized to produce the metal-oxide such as MgO, CaO, SrO, NiO, FeO, ScO, VO, CrO, CoO, MnO, CuO, SrO, NbO, PdO, CdO, BaO, SmO, and RaO with a rocksalt crystal structure. During thermal oxidation, the {0001}-texture distribution of the metal is maintained such that the rocksalt structure, {100}-texture distribution of the metal-oxide film is similar.

When Pt is deposited onto the exposed surface of the {100}-textured MgO seed layer, {100}-textured Pt is produced due to a grain-by-grain heteroepitaxial interface between the (100) plane of Pt and the (100) plane of MgO. FIG. 21 illustrates, as an embodiment example, sputter-deposited platinum stylo-epitaxial layer and the registration of the Pt atoms in the (100)-plane with the interstices of the MgO rocksalt (100)-plane as viewed along the [100]-direction. The (100)-Pt and (100)-MgO crystal structure registration, heteroepitaxy, occurs on a grain-by-grain basis. Alternative electrode metals such as Ir, Au, Pd, Ru, Ag, Cu, Ni and other FCC structure metals can be seeded with MgO or related metal oxides to produce similarly {100}-textured electrodes.

With the {100}-textured Pt or related electrode film, PZT can be grown with a {001}-texture.

Advantages

Some advantages of using the concepts and/or principles of the present invention relative to prior art devices include: 1) The thermal oxidation method of forming a rocksalt structure seed layer is self-seeding for production of {100}-texture metal-oxide films.

2) Only a single source material and deposition method is required, e.g. Mg metal target and sputter deposition tool, for producing the metal thin film.

3) The metal films for the seed layer can be grown with a thermodynamically stable texture at low temperatures, e.g. <600° C., using typical production, thin film, deposition tools.

4) The texture of the metal thin film and subsequently formed oxide can be altered by changes in the metal thin-film deposition conditions. This will allow independent control of the texture of the subsequently deposited electrode and PZT films, altered or tuned by changes in the metal film processing.

5) The oxidation process for converting the metal thin film to the oxide seed layer can be completely separated from the deposition process. The oxidation can be completed in a separate annealing tool instead of inside the metal deposition system.

6) Oxidation of the metal can be fully completed in order to obtain a thermodynamically stable film that is stable during subsequent electrode and PZT deposition.

7) The metal film could be incompletely oxidized or over-oxidized to tune the texture of the subsequent electrode and PZT layers.

8) Gaseous species other than oxygen, such as N, F, Cl, C, could be incorporated in the oxidizing gas during the metal seed layer anneal in order to tune the seed layer texture and the texture of the subsequently deposited electrode and PZT layers.

Potential Uses

Preferred embodiments and/or principles of the present invention may be used in piezoelectric-MEMS devices such as micro-switches, resonators, micro-robotic actuators, micromotors and sensors. Additionally the invention can be used in ferroelectric random access memory (FRAM), resistive random access memories, photovoltaic devices, and biocompatible electrodes.

Potential uses include, but are not limited to:
1) Thin film piezoelectric actuators in PZT MEMS.
2) Thin film piezoelectric sensor in PZT MEMS.
3) Non-volatile ferroelectric random access memories (FRAM).

4) Resistive memories that use conductive oxides, such as $TiO_2$, NiO, etc.

5) Electrodes for biological and medical applications. Electrodes with different textures will likely have different activities and interactions with bio-molecules and structures.

6) Solar cells.

Indices used herein relate to Miller indices that are used in accordance with a crystallography notation system for planes and directions in crystal (Bravais) lattices. A family of lattice planes is determined by three integers h, k, and l (the Miller indices). They are written (hkl), and each index denotes a plane. By convention, negative integers are written with a bar, as in 3 for −3. The integers are usually written in lowest terms, i.e. their greatest common divisor should be 1. For example, in a cubic Bravais lattice the Miller index (100) represents a plane orthogonal to direction h; index (010) represents a plane orthogonal to direction k, and index (001) represents a plane orthogonal to l. There are also several related notations: the notation {hkl} denotes the set of all planes that are equivalent to (hkl) by the symmetry of the lattice. In the context of crystal directions (not planes), the corresponding notations are [hkl], with square instead of round brackets, denotes a direction in the basis of the direct lattice vectors instead of the reciprocal lattice; and similarly, the notation (hkl) denotes the set of all directions that are equivalent to [hkl] by symmetry. Further information can be obtained in Wikipedia. As used herein the terminology "register" in relation to a crystallographic structure means, with respect to two adjacent granular layers, the grains in a first granular layer are in registration with and contacting grains in the adjacent layer. For example, in an embodiment, each ferroelectric grain is in registration with one electrode grain.

The terminology perovskite structure is any material with the same type of crystal structure as calcium titanium oxide ($CaTiO_3$), known as the perovskite structure, or XIIA2+VIB4+X2−3 with the oxygen in the face centers. The general chemical formula for perovskite compounds is $ABX_3$, where 'A' and 'B' are two cations of very different sizes, and X is an anion that bonds to both. The 'A' atoms are larger than the 'B' atoms. The ideal cubic-symmetry structure has the B cation in 6-fold coordination, surrounded by an octahedron of anions, and the A cation in 12-fold cuboctahedral coordination. The relative ion size requirements for stability of the cubic structure are quite stringent, so slight buckling and distortion can produce several lower-symmetry distorted versions, in which the coordination numbers of A cations, B cations or both are reduced. Generally, most perovskites, unlike Pt, have some distortion of the cubic symmetry and may even may octahedral tilting.

As used herein, piezoelectric coefficient or Piezoelectric Modulus, also known as $d_{ij}$, for example $d_{33}$, quantifies the volume change when a piezoelectric material is subject to an electric field, or the polarization on application of a stress:

$$d = \frac{P}{\sigma}$$

where P is polarization along the 3-direction, and σ is the stress along the 3-direction for the example $d_{33}$. The i, j subscripts with the d coefficient refer to the reduced matrix notation for the piezoelectric coefficients of the third order piezoelectric tensor property As used herein, texture measurements refer to measurements used to determine the orientation distribution of crystalline grains in a polycrystalline sample. A material is termed textured if the grains are aligned in a preferred orientation along certain lattice planes.

As used herein epitaxy refers to the deposition of a crystalline overlayer on a crystalline substrate, where the overlayer is in registry with the substrate at a preferred orientation of the overlayer with respect to the substrate for epitaxial growth. The overlayer is called an epitaxial film or epitaxial layer. Epitaxial deposition of a layer on a substrate matches the crystalline order of the substrate.

As used herein the terminology "growth plane" refers to the epitaxial growth planes. Growth planes and their crystallographic axes may be expressed as, for example, [112] (111) X//[1100] (0001) Y, where X and Y are crystal materials and the (111) and (0001) are faces and the brackets [ ] indicate crystallographic axes. For example, the perovskite crystal orientation having a {001} orientation means that the {001} planes of the perovskite crystal lie parallel to the growth plane.

As used herein, the term "stylo" means, in combination with epitaxy, "column," "pillar," "tube," or column-like crystal growth.

As used herein the terms columns or column-like structures refer to the column-like structures grown on top of granular regions. The column-like structures and granular regions are substantially coextensive.

As used herein the terminology thin film is a layer of material ranging from fractions of a nanometer (monolayer) to several micrometers in thickness.

As used herein the terminology "rutile" refers to a mineral composed primarily of the preferred polymorph of titanium dioxide, $TiO_2$. Rutile is the most common natural form of $TiO_2$.

As used herein the terminology "perovskite" means is the crystal structure, as depicted in FIG. 1C, of any material with the same or substantially the same type of crystal structure as calcium titanium oxide ($CaTiO_3$), known as the perovskite structure.

As used herein, the expression full width at half maximum (FWHM) is an expression of the extent of a function, given by the difference between the two extreme values of the independent variable at which the dependent variable is equal to half of its maximum value.

As used herein the terminology "crystallites" refer to small, microscopic crystals that, held together through highly defective boundaries, constitute a polycrystalline solid. Crystallites are also referred to as grains.

As used herein the terminology "rocksalt" or "sodium chloride" halite structure refers to a structure in which each of the two atom types forms a separate face-centered cubic lattice, with the two lattices interpenetrating.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. An electrical device comprising:
   a substrate;
   a textured layer formed above the substrate; the textured layer comprising metal-oxide having a rocksalt structure with a {100}-texture that provides a heteroepitaxial template;
   a platinum film layer having {100}-texture crystal orientation formed on the textured layer; the platinum film layer crystallographic texture acting as a template; and
   at least one ferroelectric material layer exhibiting spontaneous polarization stylo-epitaxially deposited on the platinum film layer;
   whereby the rocksalt structure of the textured layer facilitates the growth of the platinum film layer with a {100} orientation which forms a template for stylo-epitaxial deposition of the ferroelectric layer such that the at least one ferroelectric layer is formed with an {001} orientation that increases the magnitude of the spontaneous polarization of the at least one ferroelectric layer.

2. The device of claim 1 wherein the substrate comprises one or more from the group of silicon, Ge, GaAs, $Al_2O_3$, $ZrO_2$, MgO, spinel ($MgAl_2O_4$), Yttria Stabilized Zirconia (YSZ), $ZrO_2$, Cu, Ni, Ti, SOI, stainless steel, quartz, silicate glasses, low expansion glasses, AlN, SiC, $SiN_x.Al_2O_3$, $ZrO_2$, Cu, Ni, stainless steel, and $SiO_2$, and wherein the substrate further comprises an amorphous coating that does not have a crystal form and provides the base for the growth of crystals; the amorphous coating comprising an amorphous oxide or an amorphous nitride selected from the group of $SiO_2$, $AlO_x$, or $SiO_2/SiN_x/SiO_2$ stacks, silicate glass, $AlO_x$ ($1<x<2$), $SiN_x$ ($1<x<2$), SiC, SiON, $RuO_x$ ($1<x<2$), $ZrO_x$ ($1<x<2$), and $MgAl_2O_4$.

3. The device of claim 1 wherein the ferroelectric device is a piezoelectric device further comprising a second electrode positioned on the ferroelectric material layer, the second electrode having a thickness in the range of approximately 10 nm to 500 nm and wherein the second electrode comprises one or more of Pt, Ir, Ru, Pd, Ni, Au, Cu, Ag, $IrO_2$, $RuO_2$, $LaSrCoO_3$, $SrRuO_3$, $LaNiO_3$, or $InSnO_2$.

4. The device of claim 1 wherein the metal oxide having a rocksalt structure with a {100}-texture facilitates the epitaxial growth of {100} platinum film layer in column-like granular structures; and wherein the ferroelectric material is stylo-epitaxially grown on the {100} platinum layer in a manner that provides optimum spontaneous polarization perpendicular to the growth plane and wherein the granular regions of the ferroelectric layer and platinum film layer are in registration such that the columns in the ferroelectric layer extend from the granular regions of the platinum film layer, and wherein the crystallographic planes within the granular regions and the column-like granular structures are substantially planar to the growth plane with a tilt of less than or equal to approximately 15 degrees from the growth plane, and wherein the crystal orientation within the ferroelectric material layer is predominately {001}.

5. The device of claim 4 wherein the ferroelectric layer has a textured perovkite crystal structure and the platinum film layer has a textured face-centered-cubic crystal structure, and wherein the column-like granular structures have diameters that vary from 1 nm to 10 um and wherein the length of the columns vary from 1 nm to 500 um.

6. The device of claim 1 wherein the {100} platinum film layer has a thickness in the range of 10 to 500 nm and wherein the crystal structure is sputter deposited epitaxially.

7. The device of claim 1 wherein at least one ferroelectric layer comprises Pb $(Zr_{(x)} Ti_{(1-x)})O_3$, wherein x is less than or equal to one and wherein the ferroelectric layer comprises a perovskite crystal orientation having a {001} orientation and wherein the {001} planes lie parallel to the growth plane.

8. The device of claim 1 wherein the textured layer formed above the substrate is magnesium which when oxidized forms MgO and wherein the platinum layer is a {100}-platinum film layer that is a sputter-deposited platinum stylo-epitaxial layer and the {100} platinum thin film is formed such that the Pt atoms in the (100) plane are registered with the interstices of the MgO rocksalt (100) plane as viewed along the [100]-direction and the (100)-Pt and (100)-MgO crystal structure registration occurs on a grain-by-grain basis.

9. An electrical device comprising:
   a substrate;
   a textured layer formed on the substrate; the textured layer comprising metal oxide having a rocksalt structure that provides a heteroepitaxial template;
   a first electrode film layer having a crystallographic texture acting as a template formed on the textured layer;
   at least one ferroelectric material layer exhibiting spontaneous polarization epitaxially deposited on the first electrode film layer;
   whereby the rocksalt structure of the textured layer facilitates the growth of the first electrode film layer with a {100} orientation which forms a template for the epitaxial deposition of the ferroelectric layer such that the at least one ferroelectric layer is formed with an {001} orientation that increases the magnitude of the spontaneous polarization of the at least one ferroelectric layer.

10. The device in claim 9 wherein the first electrode film layer is a {100} oriented electrode metal selected from the group of Ir, Au, Pd, Ru, Ag, Cu, and Ni.

11. The device of claim 9 wherein the first electrode film layer is {100} oriented platinum.

12. The device of claim 11 wherein each of the at least one ferroelectric layer on the platinum film layer has a textured perovskite crystal structure including column-like structures having diameters that vary from 1 nm to 10 um and lengths that vary from 1 nm to 500 um.

13. The device of claim 9 wherein the substrate comprises one or more materials from the group of silicon, Ge, GaAs, $Al_2O_3$, $ZrO_2$, MgO, spinel ($MgAl_2O_4$), Yttria Stabilized Zirconia (YSZ), $ZrO_2$, Cu, Ni, Ti, SOI, stainless steel, quartz, silicate glasses, low expansion glasses, AlN, SiC, $SiN_x$ ($1<x<2$), $Al_2O_3$, $ZrO_2$, Cu, Ni, stainless steel, and $SiO_2$, and wherein the substrate further comprises an amorphous coating that does not have a crystal form and provides the base for the growth of crystals; the amorphous coating comprising an amorphous oxide or an amorphous nitride selected from the group of $SiO_2$, $AlO_x$, $SiO_2/SiNX/SiO_2$ stacks, silicate glass, $AlO_x$ ($1<x<2$), SiNx ($1<x<2$), SiC, AlN, SiON, RuOx ($1<x<2$), $ZrO_x$ ($1<x<2$), and $MgAl_2O_4$.

14. The device of claim 9, wherein the textured layer formed above the substrate is magnesium which when oxidized forms MgO and wherein the platinum layer is a {100}-platinum film layer that is a sputter-deposited platinum stylo-epitaxial layer and the {100} platinum thin film is formed such that the Pt atoms in the (100) plane are registered with the interstices of the MgO rocksalt (100) plane as viewed along the [100]-direction and the (100)-Pt and (100)-MgO crystal structure registration occurs on a grain-by-grain basis.

15. A method for forming the electrical device of claim 1, the method comprising:
   depositing a textured metal thin film onto a substrate;
   thermally oxidizing the metal thin film by annealing in an oxygen containing environment to convert it to a rocksalt structure oxide with a {100}-texture;

depositing a platinum film layer on the textured metal oxide thin film; and depositing a ferroelectric film on the platinum film layer;

whereby the textured metal oxide thin film acts as a seed layer for {100}-textured growth of a platinum film layer which in turn provides a heteroepitaxial template for growth of the ferroelectric film forming said electrical device.

16. The method of claim 15 wherein the substrate comprises one or more of silicon, Ge, GaAs, $Al_2O_3$, $ZrO_2$, MgO, spinel ($MgAl_2O_4$), Yttria Stabilized Zirconia (YSZ), $ZrO_2$, Cu, Ni, Ti, SOI, stainless steel, quartz, silicate glasses, low expansion glasses, AlN, SiC, $SiN_x.Al_2O_3$, $ZrO_2$, Cu, Ni, stainless steel, or $SiO_2$, and wherein the substrate further comprises an amorphous coating that does not have a crystal form and provides the base for the growth of crystals; the amorphous coating comprising an amorphous oxide or an amorphous nitride selected from the group of $SiO_2$, $AlO_x$, or $SiO_2/SiN_x/SiO_2$ stacks, silicate glass, $AlO_x$ (1<x<2), $SiN_x$ (1<x<2), SiC, AlN, SiON, $RuO_x$ (1<x<2), $ZrO_x$ (1<x<2), $MgAl_2O_4$ and the metal thin film comprises one or more of Mg, Ca, Sr, Ni, Fe, Sc, V, Cr, Co, Mn, Cu, Sr, Nb, Pd, Cd, Ba, Sm, or Ra.

17. The method of claim 15 wherein the textured metal layer is approximately 1 nm to 1 µm thick and wherein as a result of the oxidation anneal the textured layer forms a rocksalt structure metal-oxide which facilitates the formation of a granular structure.

18. The method of claim 15 wherein the substrate has an amorphous coating deposited thereon and the textured layer is deposited onto the amorphous coating, the textured layer having a thickness in the range of 1 nm to 1 µm, wherein the textured material is formed from one or more of the group of MgO, CaO, SrO, NiO, FeO, ScO, VO, CrO, CoO, MnO, CuO, SrO, NbO, PdO, CdO, BaO, SmO, and RaO with a rocksalt crystal structure and the textured layer forms a lattice match with the platinum film layer.

19. The method of claim 15 wherein the metal thin film can be grown with a thermodynamically stable texture at temperatures at or below 600° C.

20. The method of claim 16 wherein the textured metal thin film layer is magnesium which when oxidized forms MgO and wherein the platinum layer is a {100}-platinum film layer that is a sputter-deposited platinum stylo-epitaxial layer and the {100} platinum thin film is formed such that the Pt atoms in the (100) plane are registered with the interstices of the MgO rocksalt (100) plane as viewed along the [100]-direction and the (100)-Pt and (100)-MgO crystal structure registration occurs on a grain-by-grain basis.

* * * * *